United States Patent [19]

Candore

[11] Patent Number: 5,026,172
[45] Date of Patent: Jun. 25, 1991

[54] TEMPERATURE SENSOR FOR MEASURING THE SURFACE TEMPERATURE OF A ROTATING ROLL

[75] Inventor: Amedeo Candore, Bodio Lomnago, Italy

[73] Assignee: Morton International, Inc., Chicago, Ill.

[21] Appl. No.: 499,139

[22] Filed: Mar. 26, 1990

Related U.S. Application Data

[62] Division of Ser. No. 371,572, Jun. 26, 1989.

[30] Foreign Application Priority Data

Aug. 26, 1988 [IT] Italy .............................. 48305 A/88

[51] Int. Cl.$^5$ ..................... G01K 1/14; G01K 13/00
[52] U.S. Cl. ................................... 374/153; 374/208; 136/230
[58] Field of Search ............... 136/221, 222, 230, 232, 136/220; 374/120, 121, 154, 153, 151, 179, 208; 384/448, 624

[56] References Cited

U.S. PATENT DOCUMENTS

| | | | |
|---|---|---|---|
| 2,032,407 | 10/1933 | Frickey | 136/221 |
| 3,191,437 | 6/1965 | Heard | 374/153 |
| 3,464,864 | 6/1968 | Rentz | 136/221 |
| 3,934,477 | 2/1976 | Thettu | 374/153 |
| 4,091,673 | 5/1978 | Tamura | 374/120 |
| 4,199,985 | 4/1980 | Tarumi | 374/120 |
| 4,279,154 | 7/1981 | Nakamura | 136/221 |
| 4,343,961 | 8/1982 | Norton | 374/179 |
| 4,396,791 | 8/1983 | Mazzoni | 136/221 |
| 4,441,827 | 4/1984 | Coderre | 374/153 |
| 4,708,495 | 11/1987 | Kitzinger | 374/154 |
| 4,877,331 | 10/1989 | Schrörs | 374/121 |
| 4,907,894 | 3/1990 | Guyoncourt | 374/153 |

FOREIGN PATENT DOCUMENTS 0113525 5/1988 Japan .................................. 374/120

Primary Examiner—William A. Cuchlinski, Jr.
Attorney, Agent, or Firm—Gerald K. White

[57] ABSTRACT

A temperature detecting device for a rotating roll comprises an elongated bifurcated support, a roller bearing, a steel pin and a thermocouple. The roller bearing is held in place by the elongated support with a steel pin and is positioned in rolling contact with the peripheral surface of the rotating roll. As the result the bearing assume the temperature of the rotating roll and the thermocouple situated in the interior of the steel pin detects the temperature of the bearing which assumes substantially the same temperature as that of the rotating roll.

4 Claims, 21 Drawing Sheets

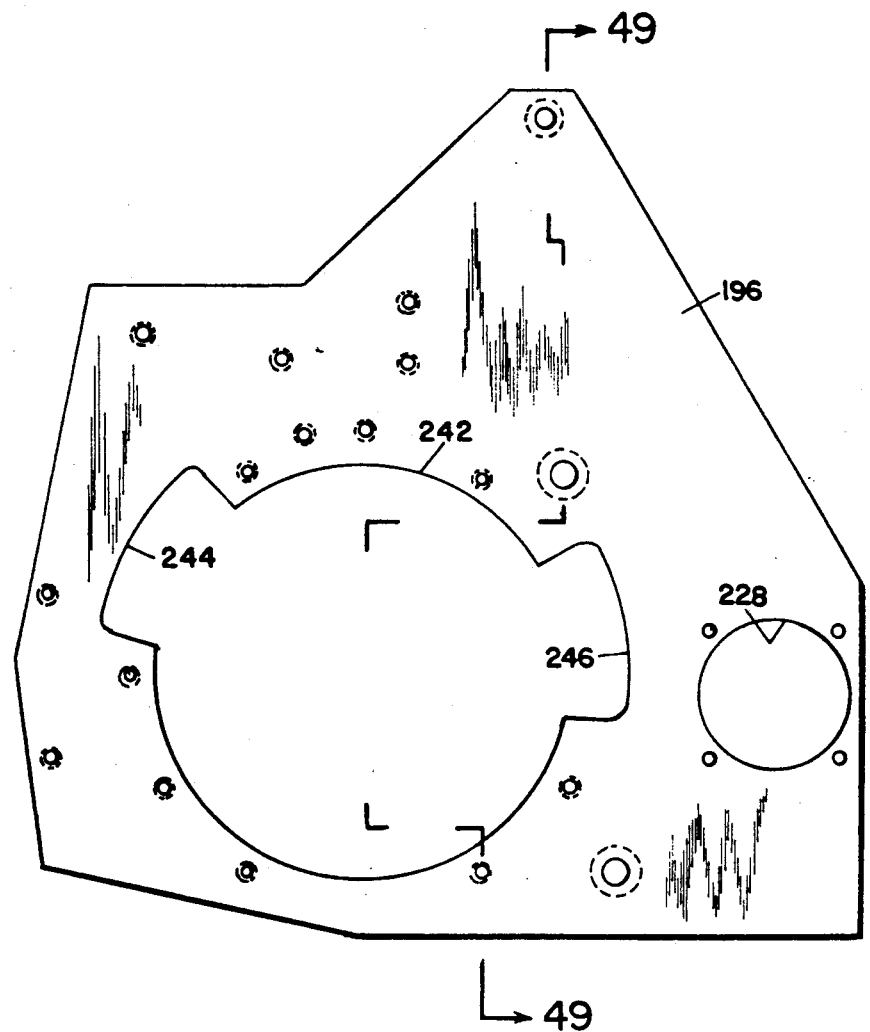
Fig. 48  Fig. 49
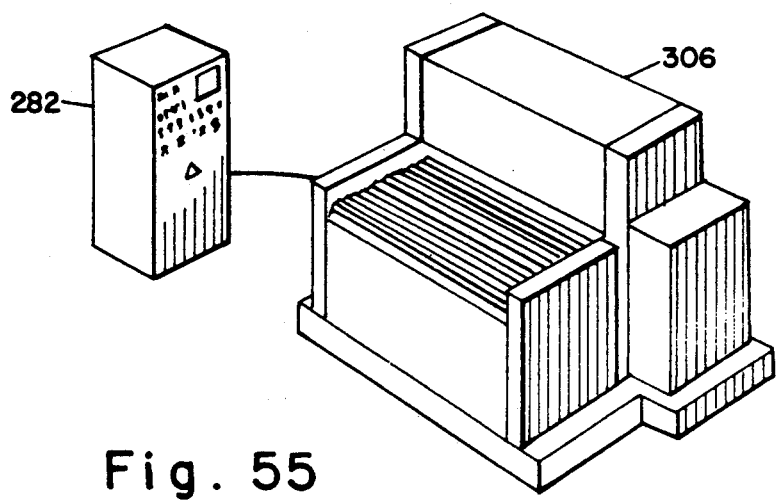
Fig. 55

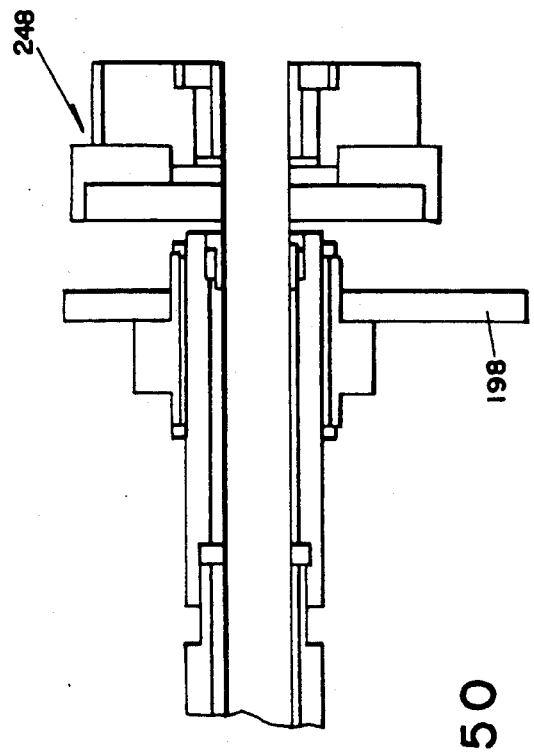
Fig. 50
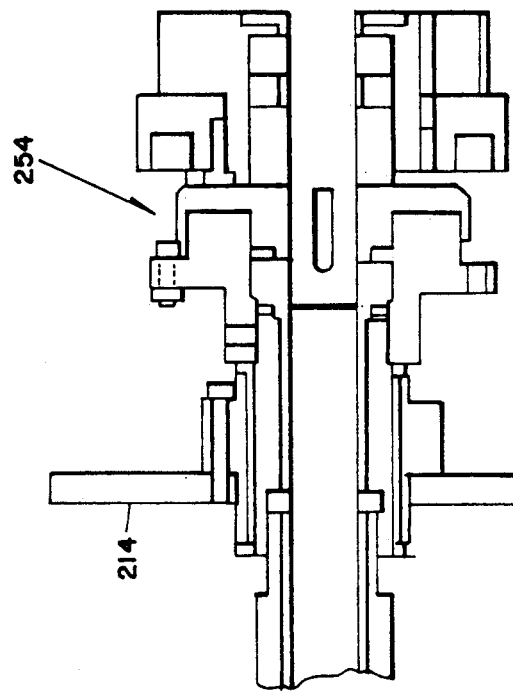
Fig. 51
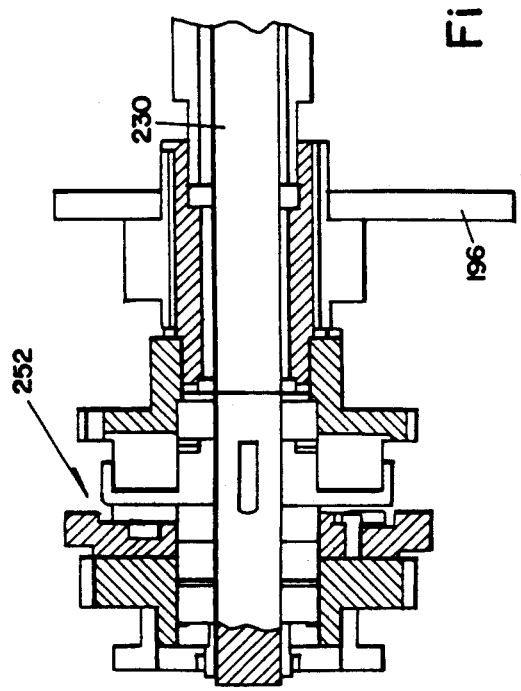
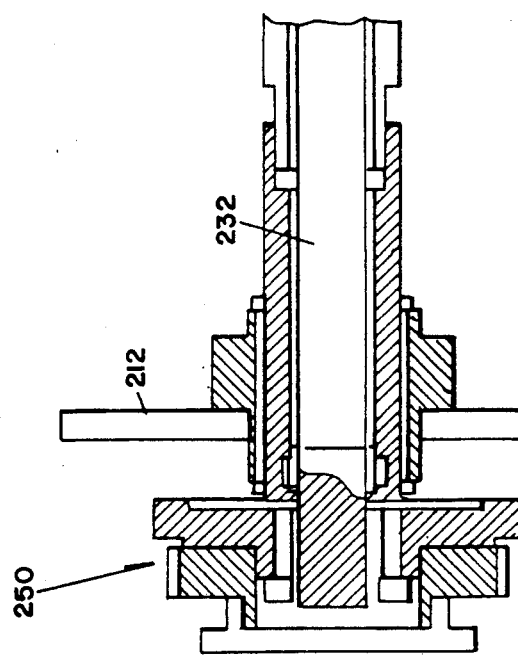

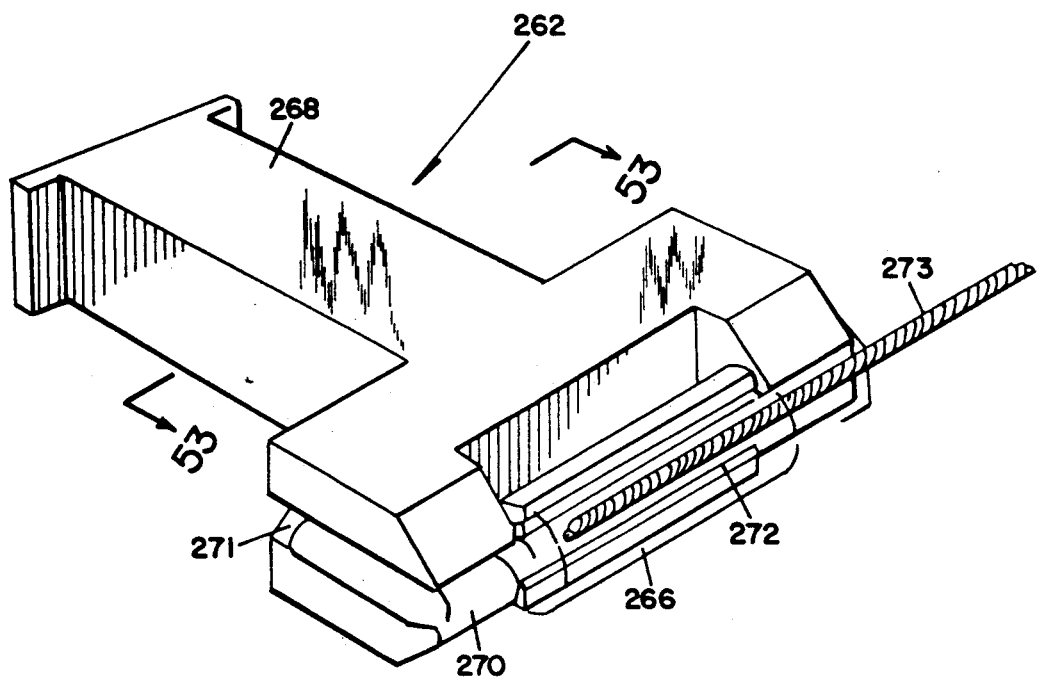
Fig. 52
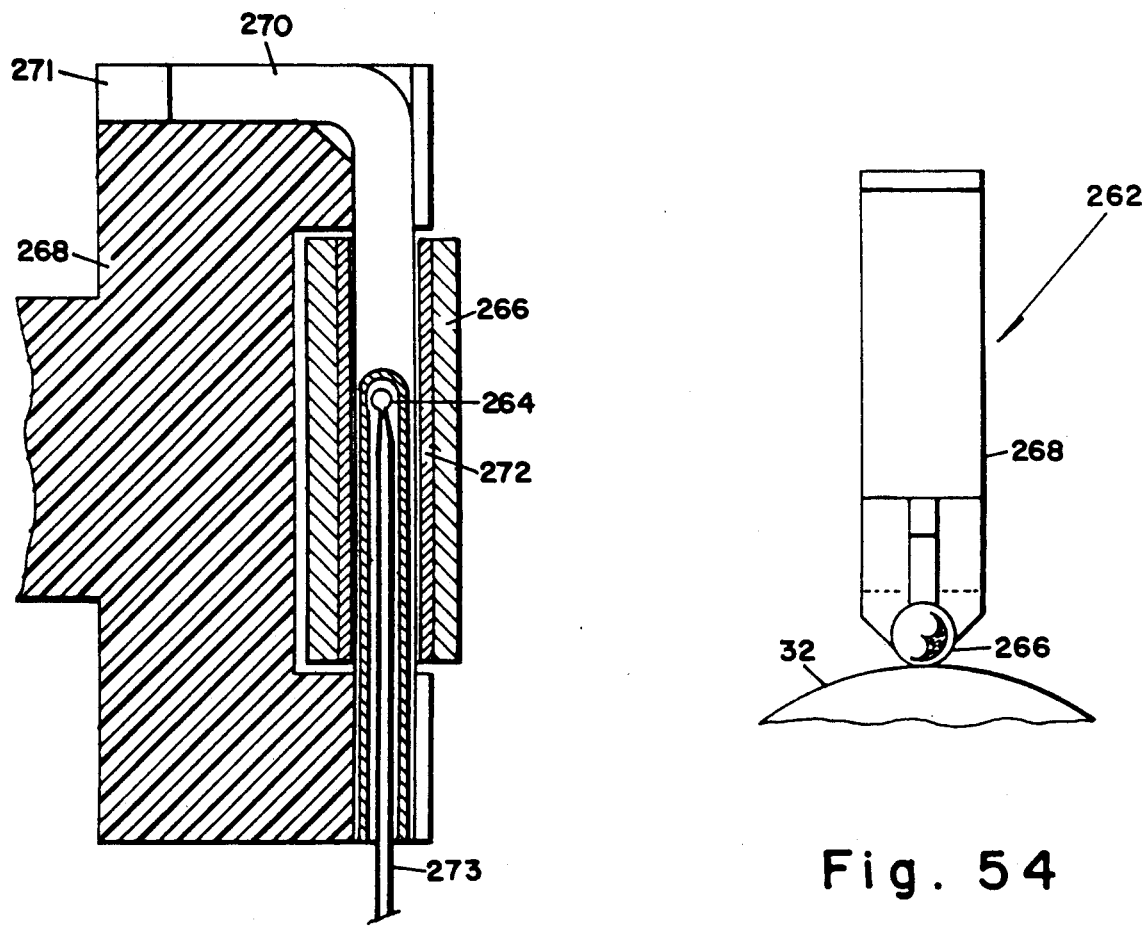
Fig. 53
Fig. 54

TEMPERATURE SENSOR FOR MEASURING THE SURFACE TEMPERATURE OF A ROTATING ROLL

This is a divisional of co-pending application Ser. No. 371,572, filed on June 26, 1989.

BACKGROUND OF THE INVENTION

1. Field of the Invention

The present invention relates to the automatic lamination of circuit boards or other substrates with a dry film of photopolymer resist material, and more particularly, to a tacking and laminating method and apparatus that enables an increased speed of lamination with greater reliability of film adherence to the substrates.

2. Description of the Prior Art

Dry films of curable photopolymer resist material have been developed for use in the manufacture of printed circuit boards. Such boards have particular use in the electronics industry. A particularly advantageous form of such film that is available commercially is disclosed in U.S. Pat. No. 3,887,450, entitled "PHOTOPOLYMERIZABLE COMPOSITIONS CONTAINING POLYMERIC BINDING AGENTS." U.S. Pat. No. 3,887,450 was granted to Michael N. Gilano et al. and is assigned to the assignee of the present invention. As manufactured, the dry film photopolymer is characterized in being easily contaminated. It is also tacky and limp. Although tacky, the film is "peelable." This makes it possible to use polyethylene cover film for protection and for facilitating handling. The composite is packaged in reels. Typically, such dry films of photopolymer have thicknesses of 1.0, 1.5, 2.0, and 3.0 mils, and have widths in the range of six (6) inches to thirty (30) inches.

Machines, termed laminators, are known in the prior art for applying dry films of curable photopolymer to the surfaces of each of a plurality of printed circuit boards in succession. In one form thereof, such laminators utilize a so-called two-step laminating process consisting, in a first step, of pressing in the presence of heat, the leading end of a film sheet into pressure sealed contact with the face of the board at a forward portion thereof, a step referred to hereinafter as "tacking;" and in a second step, feeding the board, with the film sheet trailing behind, between heated pressure or lamination roller means for compression bonding of the film sheet onto the face of the board, a step referred to hereinafter as "laminating."

Thus, as disclosed in U.S. Pat. Nos. 3,658,629 to L. P. Cramer et al., 4,025,380 to E. T. Bernardo 4,650,536 to A. B. Ceraso and 4,659,419 to E. Miyake, each of a plurality of blank boards is transferred, in turn, to a film web tacking station of the laminator where the leading end of a continuous length of film web is tacked to a forward end portion of the board. The board is then transferred to and moved through a laminating station, with the film web being pulled along, where lamination rolls cause the film web to become bonded to the board. During the laminating operation, the film web is cut to form a film portion of predetermined length that matches the length of the board.

Such film sheet portions may simultaneously be applied to the opposite sides of the board with each film portion being of the same, larger or smaller size than that of the board being laminated. As disclosed in the aforementioned U.S. Pat. No. 4,650,536 to A. B. Ceraso, applying a smaller film sheet portion which fits within the perimeter of the board advantageously leaves free the edges thereof in which centering holes may be disposed for use in subsequent printed circuit board processing operations.

It is further known in the prior art, as disclosed in the aforementioned U.S. Pat. No. 4,659,419 to E. Miyake, to effect the cutting operation of the film web without interrupting the laminating operation. As there disclosed, the film web cutting system consists of a circular rotating cutting blade which is moved across the width of the film web while at the same time being moved toward the laminating station in the same direction and at the same speed as the film web is being moved thereto.

The prior art laminators are characterized in that the portion of the film web at the leading end thereof that is tacked to the board has a length of a few millimeters only. Moreover, the location where the end of the film web is tacked to the board is spaced a distance of several centimeters from where the laminating action begins. Upon completion of the tacking operation, the board is pushed forward under a lamination roll in the laminating station. This action subjects the film web to a pulling force which places the film web under tension. Such tension on the film web creates a problem, giving rise to a critical situation, as there is a tendency for the film web to be pulled away from and off the board from the region where it had been tacked, laminating action not yet having begun, as illustrated herein in FIG. 1 of the drawings.

A critical situation develops also, when a single side only of a board is being laminated. In this case, the pulling force and resulting tension on the film web tends to cause the board to bend. This problem is most pronounced with thin boards, as illustrated herein in FIG. 2 of the drawings.

The tendency for such critical situations to develop with the prior art laminators requires that the tacking be effected under high pressure and temperature for a sufficient time to effect a tight bond and also places a restriction on the magnitude of the force that may be applied to the film web while the board is being advanced toward the laminating station, and hence, on the speed at which the board may be so advanced. These factors detract seriously from the efficiency of lamination and are significant in determining the number of boards that may be satisfactorily laminated in any given period.

Another factor that is a determinant of the efficiency of lamination is the film web cutting time, that is, the elapsed time required for the rotary cutting blade to be moved across the width of the film web to effect the film sheet portion cutting action. With the rotary blade cutting system of the prior art, the elapsed time required for cutting the film web is sufficiently long, being of the order of several seconds, that it also is a significant factor in determining laminating efficiency, not only in respect of reducing the number of boards that may be laminated in a given period but also in respect of restricting the shortest length of board that may be laminated in the machine to a size larger than desired.

Thus, there exists a need and a demand for improvement in the method of and apparatus employed for tacking, laminating, and film cutting to the end of achieving greater efficiency and reliability of lamination. The present invention was devised to fill the technological gap that has existed in the art in these respects.

SUMMARY OF THE INVENTION

An object of the invention is to provide an improved method of and apparatus for tacking and laminating film sheet to boards or other substrates or support members which avoids the aforementioned problems encountered in the prior art in the production of film sheet laminated products.

Another object of the invention is to provide a process for laminating a film of material to each support member in a succession of support members each of which has a face, a forward end and a rearward end, comprising the sequential steps of:

a) gripping the leading support member of the succession of support members and advancing such support member to position a face portion at the forward end thereof in cooperative relation with first and second surfaces that alternately are movable toward and away therefrom;

b) supplying a length of film of material having a leading end with the leading end thereof held adjacent said first movable surface;

c) initiating relative movement of said first movable surface to press the leading end of said film into pressure contact with the forward face portion of the support member thereby to tack the leading end of the film thereto;

d) while maintaining the support member immobile, initiating movement of said first movable surface to effect the separation thereof from the forward face portion of the support member and subsequently initiating movement of the second movable surface into pressure contact with substantially the same forward face portion of the support member to which the leading end of the film had been tacked;

e) advancing the support member relatively to the second movable surface with pressure contact maintained therebetween, to press the film along the length thereof to the face of the support member, and f) repeating steps (a) through (e) for each of the remaining support members in the succession of support members.

Another object of the invention is to provide a method of tacking and laminating the leading end of a film web to the forward end of a board to be laminated that enables, compared to the laminators of the prior art, not only a reduction in time required for the tacking operation but also a reduction in the temperature and pressure required for the tacking operation.

A further object of the invention is to provide, in a laminator used for production of film sheet laminated boards or other substrates or support members, a method for minimizing the elapsed time required for cutting a film web portion from a continuous length of film web to form a film sheet without interrupting the laminating operation.

Still another object of the invention is to provide an automatically operative laminator for carrying out the above-mentioned methods.

In accordance with the present invention, the method of tacking and laminating film sheet to boards or other substrates or support members involves the steps of transferring a blank board or other support member into cooperative relation with a film web supply system of the laminator, tacking the leading end of a continuous film web from a reel of film to a forward end portion of the board, and starting the lamination of the film web to the board at the same position or region at which the tacking has been effected, with the board being held motionless between the tacking operation and the beginning of the laminating operation. Thus, in the interval between the tacking operation and the beginning of the laminating operation, the film web is not subjected to a pulling force, as in the laminators of the prior art, which pulling force tends to pull the film web off the board from where it has been tacked. As a consequence, in accordance with the present invention, the tacking operation no longer is a critical undertaking and can be performed successfully at low temperature and pressure and in a minimum of time. Pulling force on the film web, as the board is moved into the laminating mode, is not a factor, as in the prior art, in determining the number of boards that may be laminated in a given period. Additionally, single side lamination of boards is possible without any involvement of the bending problem with thin boards that has been encountered in the prior art.

The system provided in accordance with the present invention for cutting the film web is of the shears type. The elapsed time required for cutting across the entire width of the film with this cutting system is extremely short, being about 0.3 seconds. This is shorter by about a factor of 10 than the elapsed time required by the prior art rotary blade cutters.

The cutting unit in accordance with the invention is located eccentrically with respect to the lamination rolls, making it possible in one embodiment of the invention for the minimum board length to be very short, specifically 170 mm. (6.7 inches) in one embodiment of the invention. The cutting structure is simple and very efficient. The cutting blade is required to travel a distance of only a few millimeters.

Thus, the present invention enables the achievement of a highly efficient lamination operation, as tacking and cutting are in no way critical.

While the present invention is described in connection with the application of dry films of photopolymer resist material for use in the manufacture of printed circuit boards, it will be understood that the films for application to boards or other substrates may be masking or other films or sheets and that the boards or substrates to which the film sheet is applied may comprise copper laminated glass epoxy board, paper board, plastic board, etc., in accordance with the application requirements. The thickness of the boards or substrates may be in the range from 0.1 to 4.0 mm. (0.004 to 0.15 inches).

The various features of novelty which characterize the invention are pointed out with particularity in the claims annexed to and forming a part of this specification. For a better understanding of the invention, its operating advantages, and specific objects attained by its use, reference is made to the accompanying drawings and descriptive matter in which a preferred embodiment of the invention is illustrated.

BRIEF DESCRIPTION OF THE DRAWINGS

With this description of the invention, a detailed description follows with reference being made to the accompanying figures of drawing which form part of the specification, in which like parts are designated by the same reference numbers, and of which:

FIG. 48 is a plan view of an angularly adjustable shoulder that is provided at each end of each of the tacking/cutting devices and lamination rolls for the support thereof;

FIG. 49 is a view taken along the lines 49—49 of FIG. 48;

FIG. 50 is a view illustrating the support of the tacking/cutting and lamination roll structures by the angularly adjustable shoulders and the actuation of the latter to effect movements of the tacking/cutting devices and the laminating rolls toward and away from a board to be laminated;

FIG. 51 illustrates electromagnetic coupling devices for controlling the selective actuation of the tacking-/cutting devices and of the laminating rolls;

FIG. 52 is a perspective view of a contacting type temperature detector that is employed for measuring the surface temperature of each of the laminating rolls;

FIG. 53 is a cross sectional view taken along the lines 53—53 of FIG. 52;

FIG. 54 is a view in side elevation showing the temperature detector in rolling contact with a lamination roll; and FIG. 55 is a perspective view illustrating a cabinet in which the main body of the laminator is housed and a mobile cabinet housing electronic controls for the laminator.

DESCRIPTION OF THE PRIOR ART

Figure 1:
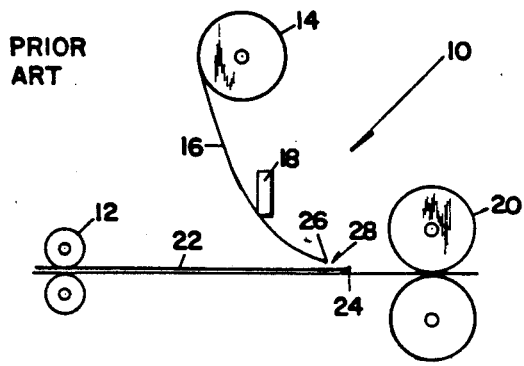
FIG. 1 is a schematic illustration typifying the tacking and laminating method of the prior art.

FIG. 1 schematically illustrates a laminator 10 according to the prior art. As shown, the laminator 10 comprises input rolls 12, a reel 14 of film 16, a tacking bar 18 and lamination rolls 20. The input rolls 12 push or advance a board 22 to be laminated along a track (not shown) to bring the forward end 24 thereof into a position where it is in cooperative relation with the leading end 26 of the film 16 and the tacking bar 18. The board is stopped at that position following which the tacking bar 18 is moved down to exert force upon and thereby to tack the leading end 26 of the film 16 to the forward end 24 of the board 22. After the tacking operation, the board 22 is pushed forward by the input rolls 12 under the lamination rolls 20. The lamination rolls 20 are spaced a distance, typically several centimeters, forward of the tacking bar 18 in the path of movement of the board 22. This gives rise to a critical situation as the film 16, which is tacked to the board for only a few millimeters along the length thereof, is subjected to a pulling force. It may happen, and there is a natural disposition toward such happening, that the leading end 26 of the film 16 will be pulled from the board 22 as indicated at 28. This necessitates the use of heat and pressure for a sufficient time to ensure a good bond during the tacking operation, and movement forward of the board 22 at a rate sufficiently slow to preclude pulling the end of film 16 off the board 22, thus reducing the laminating efficiency, and resulting in a corresponding reduction in the number of boards 22 that may be laminated with a sheet of film 16 in a given period of time.

Figure 2:
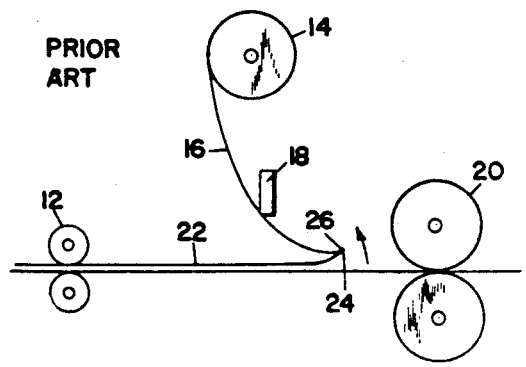
FIG. 2 is a schematic illustration showing the bending of boards, particularly of thin boards that is encountered in single side lamination of boards employing the prior art tacking and laminating method illustrated in FIG. 1.

FIG. 2 schematically illustrates the bending of boards, particularly of thin boards, that is encountered with the arrangement of the tacking bar 18 and lamination rolls 20 of the prior art laminators. As shown in FIG. 2, the pulling force on the film 16, as the board 22 to be laminated is pushed forward, causes the forward or leading end of the board to be bent upward in single side lamination. The board 22 bends since the film 16 has been tacked on one side only, there being no countervailing force on the other side. Single side lamination, particularly of inner layers on thin boards, thus, is critical and reduces laminating efficiency.

DESCRIPTION OF A PREFERRED EMBODIMENT OF THE INVENTION

Figure 3:
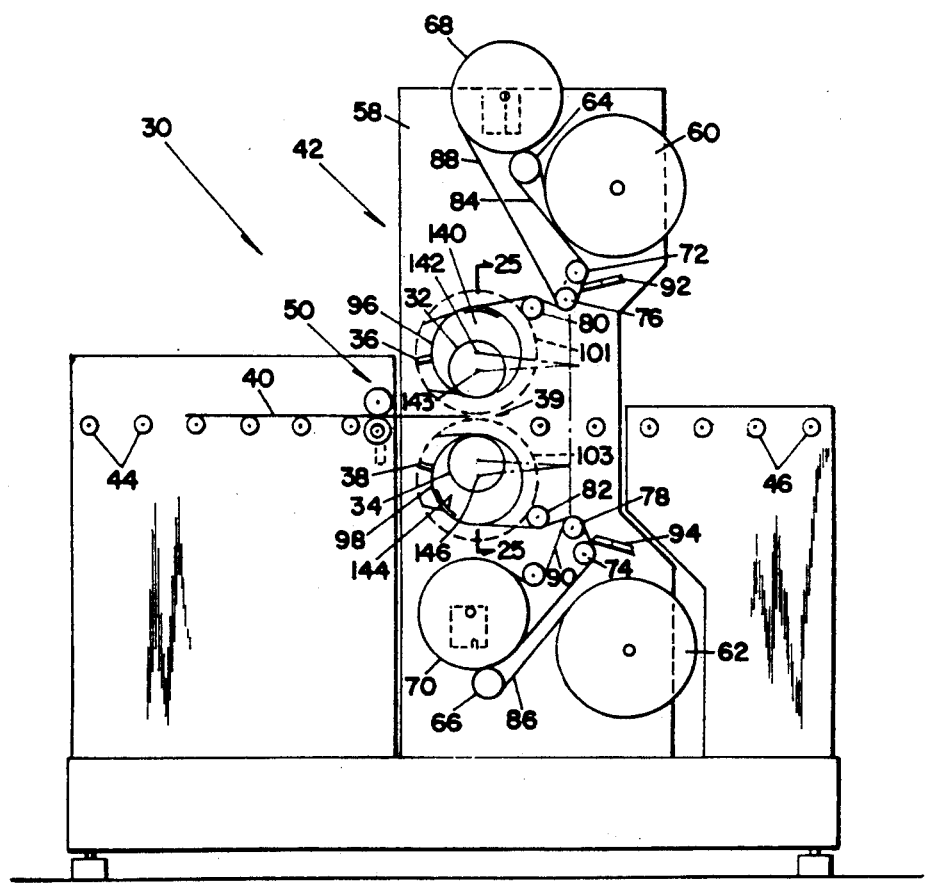
FIG. 3 is a side view of a laminator constructed in accordance with a preferred embodiment of the invention.

Referring to FIG. 3, the laminator 30 of the present invention comprises upper and lower suitably heated lamination rolls 32 and 34 that are paired, respectively, with upper and lower tacking/cutting devices 36 and 38 in a tacking and laminating station 39. Devices 36 and 38 revolve eccentrically with respect to the lamination roll 32 or 34 that is associated therewith. During the various steps in the lamination process, the pair of lamination rolls and tacking/cutting devices 32, 36 and 34, 38 are simultaneously pushed from opposite directions, that is, from upper and lower positions, as seen in FIG. 3, against opposing sides of a board 40 to be laminated, and moved apart from it.

The laminator 30, as shown in FIG. 3, comprises, in addition, a main body 42, an input conveyor means 44, and an output conveyor means 46 for the boards 40 to be laminated. To provide for the lamination of a film sheet simultaneously on both sides of the board 40, the laminator main body 42 is arranged symmetrically with respect to the pair of lamination rolls and tacking/cutting devices 32, 36 and 34, 38 and the planes containing the input conveyor means 44 and the output conveyor means 46.

Figure 4:
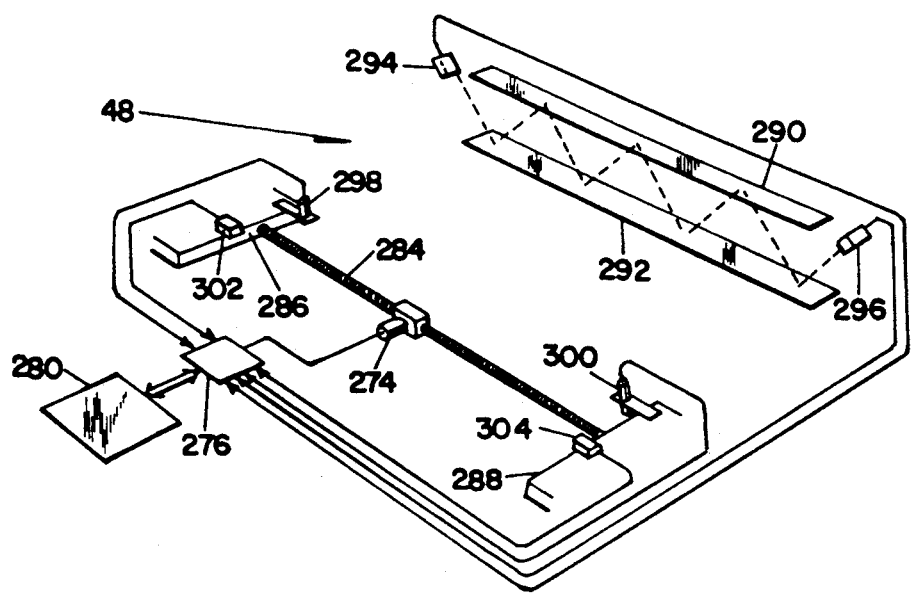
FIG. 4 is a schematic illustration of an automatic centering device employed in the laminator of FIG. 3 for centering incoming boards entering the laminator to be laminated.

Each incoming board 40 is detected and centered by an automatic centering device 48 which is illustrated in FIG. 4, although not shown in FIG. 3. Detailed descriptions of the automatic centering device 48 and the manner of the operation thereof are provided hereinafter.

Figure 5:
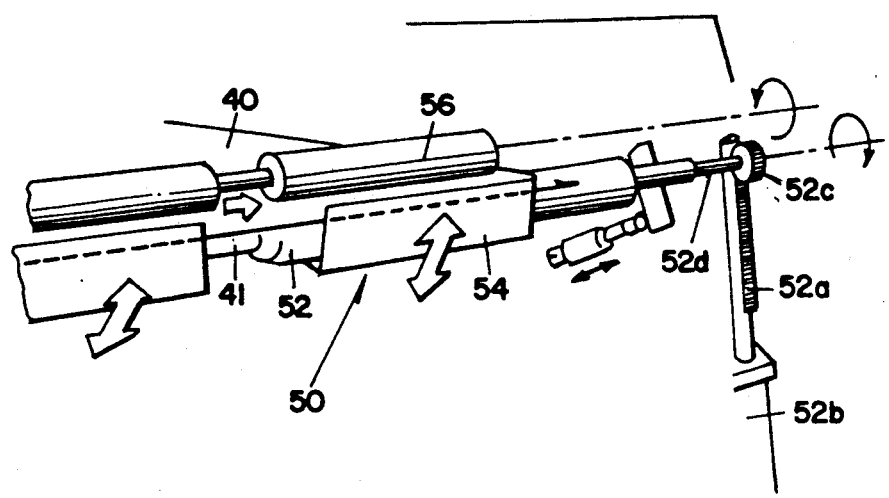
FIG. 5 is a fragmented perspective view illustrating an incoming board as being front centered by a barrier positioned adjacent a lower input roll.
Figure 6:
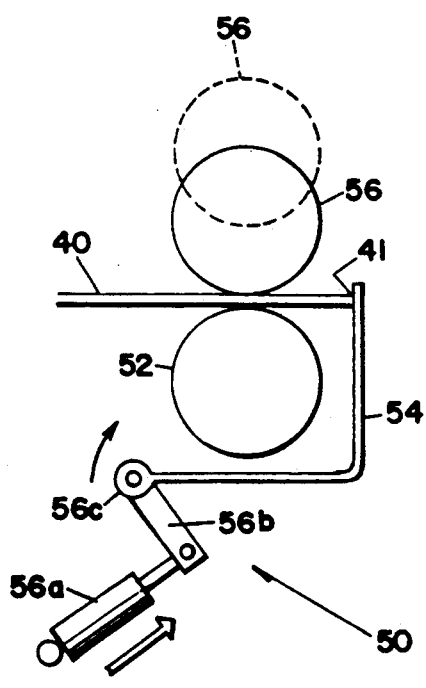
FIG. 6 is an end view illustrating the front centered board of FIG. 5 as being gripped by an upper input roll.

Associated with the automatic centering device 48 is a front centering and front edge adjustment device 50 which is illustrated in FIG. 5. Device 50 includes a barrier 54 that is positioned in cooperative relation with a lower input roll 52 and an upper input roll 56. As advanced into the laminator 30 by the input conveyor means 44, each incoming board 40 normally rests on the lower input roll 52 with the front edge 41 thereof moved into abutting relation with the barrier 54. Such movement causes the front edge 41 of the board 40 to be angularly shifted to squarely face the tacking and laminating station 39 if not already in such a position. Upon lowering thereof into contact with the board 40, as shown in FIG. 6, the upper input roll 56 grips the board 40. The lower roll 52 rotates and advances the board 40 into the laminating station 39.

As shown in FIG. 5, the lower input roll 52 is actuated by a rack 52a that is fixed to the shaft of an air cylinder 52b. The rack 52a is positioned in cooperative relation with a pinion 52c that is fixedly attached to the shaft 52d of the lower input roll 54.

The travel of the cylinder, and consequently, the number of revolutions of the lower input roll 52 and the distance advanced by the board 40 are determined by a positive stop on the cylinder 52b. The travel of the shaft of the cylinder 52b depends upon the position of the positive stop.

The positive stop (or register) is moved by a d.c. micromotor (not shown) which may be similar to the motor used for the automatic centering device 48 described hereinafter. The d.c. micromotor is controlled directly by a Programmable Logic Control (PLC) in accordance with an edge value preset by the operator.

Figure 7:
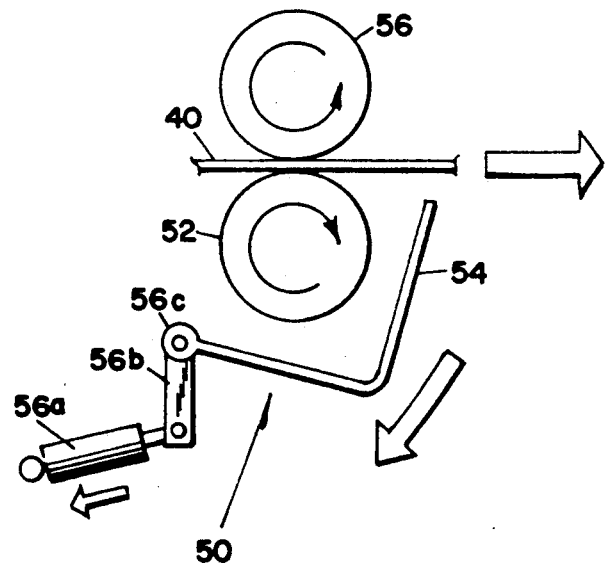
FIG. 7 is an end view illustrating the lower roll as rotating and advancing the front centered board of FIG. 5 to a tacking and laminating station.

The front barrier 54 which stops the board 40 with the forward edge 41 squarely facing the laminating station 39, that is, in parallel relation with respect to the tacking bars of the tacking and cutting devices 36 and 38, is actuated by an independent air cylinder 56a and a lever 56b. Specifically, one end of lever 56b is connected to the end of the shaft of the cylinder 56a and the other end thereof is fixedly attached to the lower end of the barrier 54 which, as best seen in FIGS. 6 and 7, is L-shaped.

When the laminator 30 is in operation, the output conveyor means 46 travels at the peripheral speed of the lamination rolls 32 and 34. The speed of the input conveyor means 44 is not related to the speed of the laminating rolls 32 and 34. Actually, the input conveyor means 44 stops after the board 40 has been centered and brought forward against the barrier 54.

The laminator 30 includes plate-like support frames at the opposite sides thereof, of which one only, that bearing reference numeral 58, is shown in FIG. 3. Rotatably mounted between the support frames are two film supply rolls or reels 60 and 62 of dry film photoresist material, two film feed rolls 64 and 66, two take-up rolls 68 and 70, two guide rolls 72 and 74, two stripping rolls 76 and 78, and two tension rolls 80 and 82.

Each reel 60 and 62 carries a respectively associated continuous film web 84 and 86 wound around the circumference thereof. The film webs 84 and 86 are each laminated with a respectively associated protective material 88 and 90, which protective material may be a polyethylene. Each of the protective materials 88 and 90 is stripped from the associated film web 84 and 86 by the respectively associated stripping roll 76 or 78 and is wound up on the respectively associated take-up roll 68 or 70.

Associated with each of the stripping rolls 76 and 78 is a respectively associated cutting blade 92 and 94 for effecting longitudinal cutting of the dry film webs 84 and 86. Means not shown in FIG. 3 may be provided for effecting lateral adjustment of the cutting blades 92 and 94 with respect to the film webs 84 and 86 for accommodating the lamination of boards 40 of different widths.

Positioned between the support frames 58 are the lamination rolls 32 and 34 and the respectively associated eccentric tacking/cutting devices 36 and 38. The film webs 84 and 86 are drawn in sliding relationship over a respectively associated fixed curved film guiding surface 96 and 98, which guiding surfaces are associated with the tacking/cutting devices 36 and 38.

Figure 8:
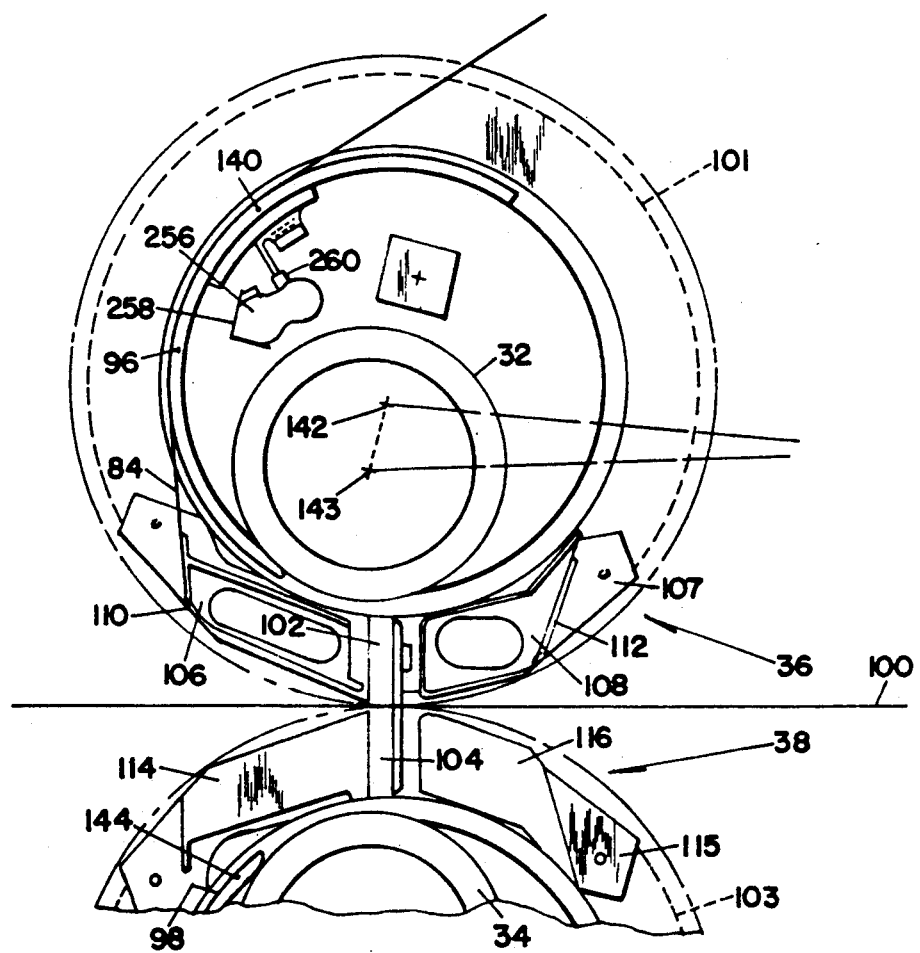
FIG. 8 is a view on a scale larger than that shown in FIG. 3 of upper and lower eccentric tacking devices and lamination rolls, with the tacking devices in tacking position and the lower tacking device and lamination roll partially broken away.

As best seen in FIG. 8, the tacking/cutting device 36 and the associated lamination roll 32 is positioned above a plane 100 in which boards 40 to be laminated are placed while the tacking/cutting device 38 and lamination roll 34 are positioned below the plane 100.

In FIGS. 3 and 8, the paths through which the tacking/cutting devices 36 and 38 move as they are rotated about the respectively associated lamination rolls 32 and 34 are indicated by the reference numerals 101 and 103.

In a first step in the operation of the laminator 30, the tacking/cutting devices 36 and 38 converge simultaneously from opposite directions toward a board 40 placed in the plane 100 to press and thereby tack the leading end of a respectively associated film web 84 and 86 against the forward end thereof. In a second step, while the devices 36 and 38 are being separated and with the board 40 being maintained immobile, the lamination rolls 32 and 34 converge simultaneously from opposite directions toward the board 40 to press the tacked leading end of an associated one of the films 84 and 86 against the board at precisely the same position where tacking had been effected. The board 40 is then advanced to effect the lamination of the film webs to the surface thereof by the lamination rolls 32 and 34.

Figure 25:
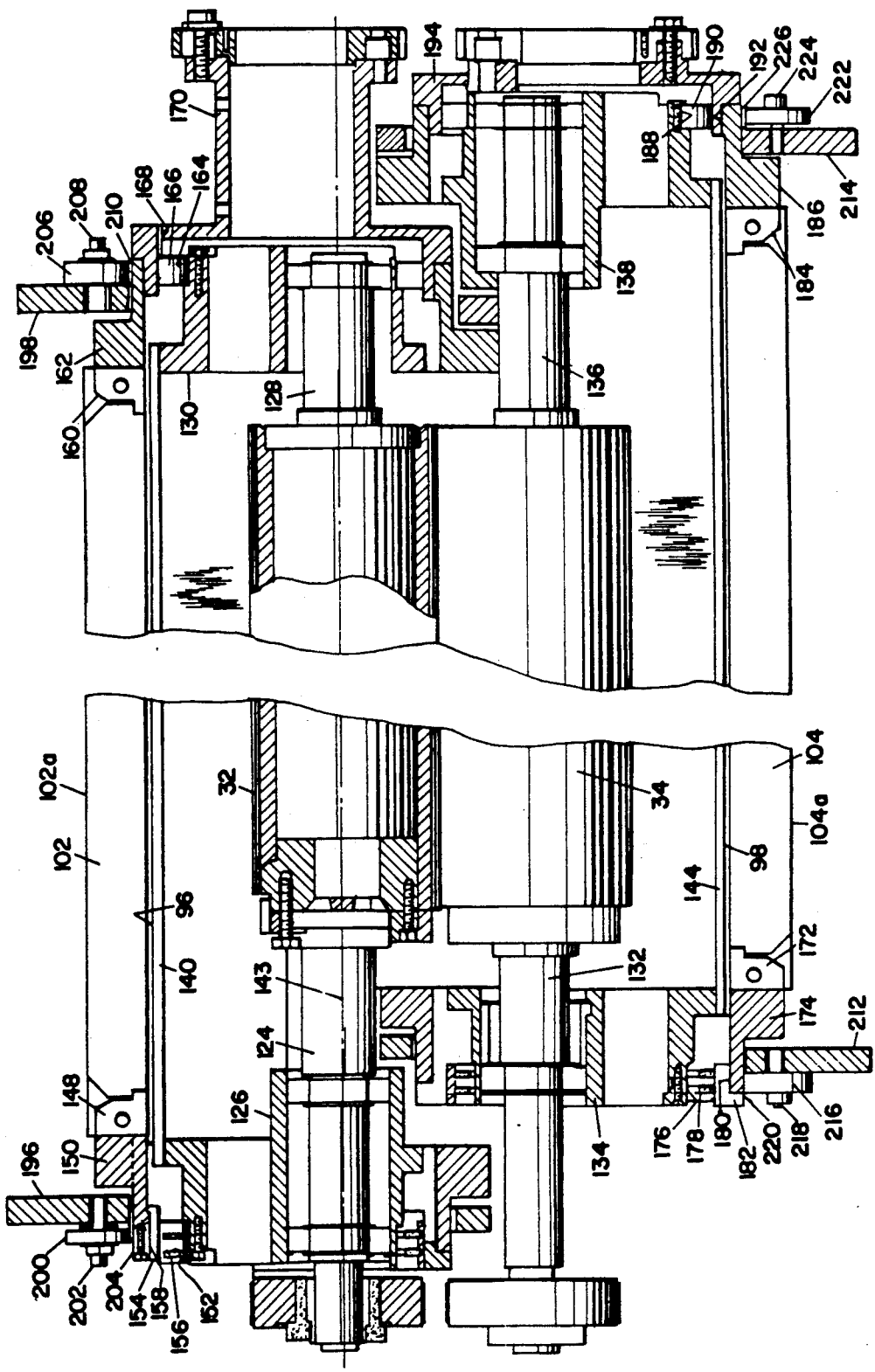
FIG. 25 is a section taken along the lines 25—25 of FIG. 3 modified, however, for clarity of illustration, to show each of the laminating rolls in laminating position and with the upper and lower eccentric tacking devices rotated to extreme upper and lower positions, respectively.

The tacking/cutting devices 36 and 38 include respectively associated suitable heated tacking bars 102 and 104. The tacking bars 102 and 104, as best seen in FIG. 25, are mounted between respectively associated pairs of flanges 150, 162 and 174, 186.

Angularly positioned on a vacuum sector 107 on the opposite sides of the tacking bar 102 are vacuum shoes 106 and 108 which have respectively associated film web contacting surfaces 110 and 112. Similarly angularly positioned on a vacuum sector 115 on the opposite sides of the tacking bar 104 are vacuum shoes 114 and 116 having similar respectively associated film web contacting surfaces. The vacuum shoes 106, 108, 114 and 116 may be connected to a common vacuum source such, for example, as a vacuum pump (not shown) by individually associated branch vacuum lines (not shown). A separate control valve may be provided in each such line.

The tacking bars 102 and 104 are rotatable in opposite directions around the respectively associated lamination roll 32 and 34 during the operation of the laminator 30. Specifically, the tacking bar 102 is rotatable in a counterclockwise direction and the tacking bar 104 in a clockwise direction viewing, as seen in FIG. 8.

Figure 9:
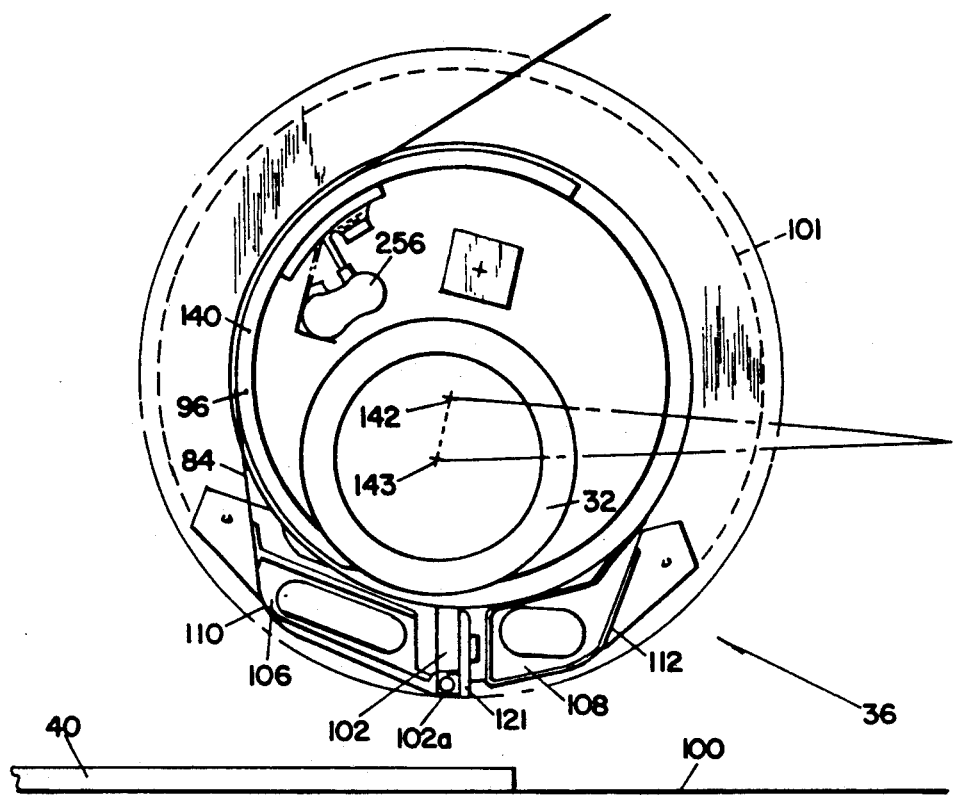
FIG. 9 illustrates the positioning of a board to be laminated with the upper eccentric tacking device and lamination roll stationary, the tacking device being in the right position to effect the tacking, the lower eccentric tacking device and lamination roll not being shown.

FIG. 9 shows a board 40 to be laminated positioned under the tacking/cutting device 36 and associated lamination roll 32. The tacking/cutting device 38 and associated lamination roll 34 are not shown in FIG. 9 in the interest of brevity of illustration inasmuch as the device 38 and lamination roll 34 substantially comprise a mirror image of device 36 and lamination roll 32.

Initially, the two tacking/cutting devices 36 and 38 are stationary and are held apart from each other in the correct position to effect the desired tacking of the respective leading ends of the film webs 84 and 86 to the opposite sides of the board 40 at the forward end thereof. The film web 84, as shown in FIG. 9, is drawn over the fixed curved surface 96 and is held in position by suction force provided by the vacuum shoe 110, with the leading end of the film web 84 being positioned under and adjacent the tacking bar 102.

Figure 10:
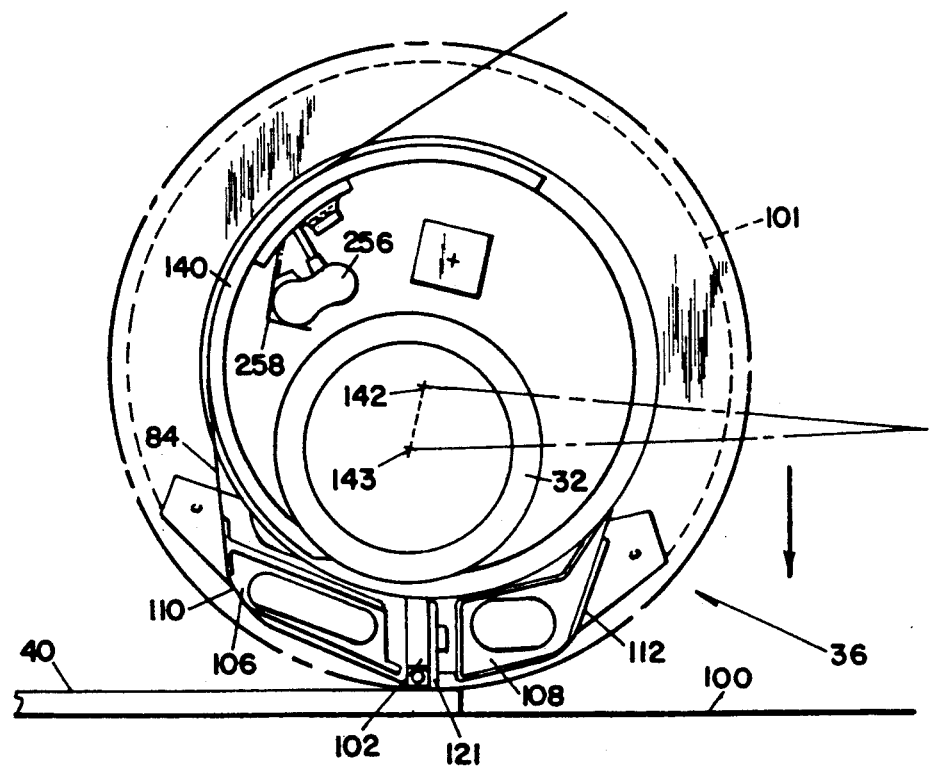
FIG. 10 illustrates the approach of the upper tacking device to the board.

In effecting the tacking operation, as shown in FIG. 10, the tacking/cutting device 36 is moved toward the board 40 to cause the tacking bar 102 to press the leading end of the film web 84 firmly into contact with the surface of the board 40 adjacent the forward end thereof. The tacking temperature, pressure, and time are all adjustable. When the tacking operation has been completed, the film web 84 is not subjected to any pulling force until after the lamination operation begins. The tacking, therefore, can be effected at low temperature and pressure and in a minimum time. At this point, the vacuum in the vacuum shoes 106 and 114 is released by the activation of two electrovalves.

The tacking of the film web 86 to the opposite side of the board 40 by the tacking/cutting device 38 is effected simultaneously with the tacking of film web 84 to the board 40, and in a similar manner, by causing the tacking bar 104 to press the leading end of the film web 86 against the board 40 adjacent the forward end thereof.

Figure 11:
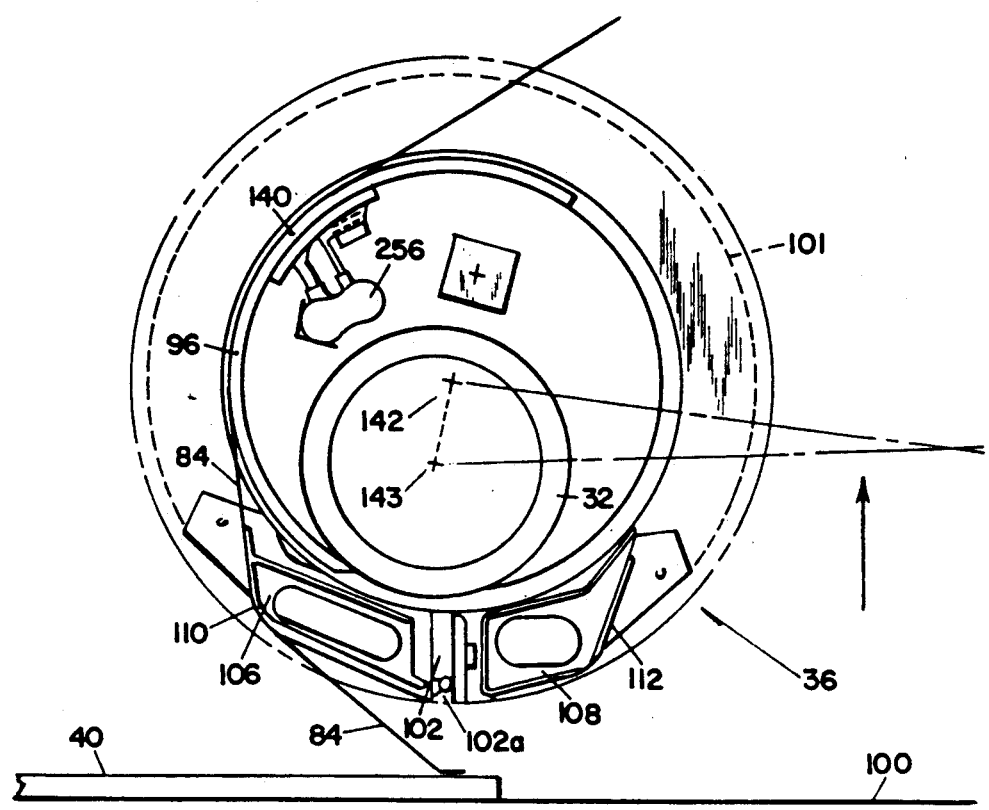
FIG. 11 illustrates the setting of the upper tacking device apart from the board after the leading end of a film of photopolymer resist material has been tacked to the board.

After the tacking operation has been completed, the two eccentric tacking devices 36 and 38 are moved apart, with the film webs 84 and 86 tacked to the board 40, as shown in FIG. 11.

Figure 12:
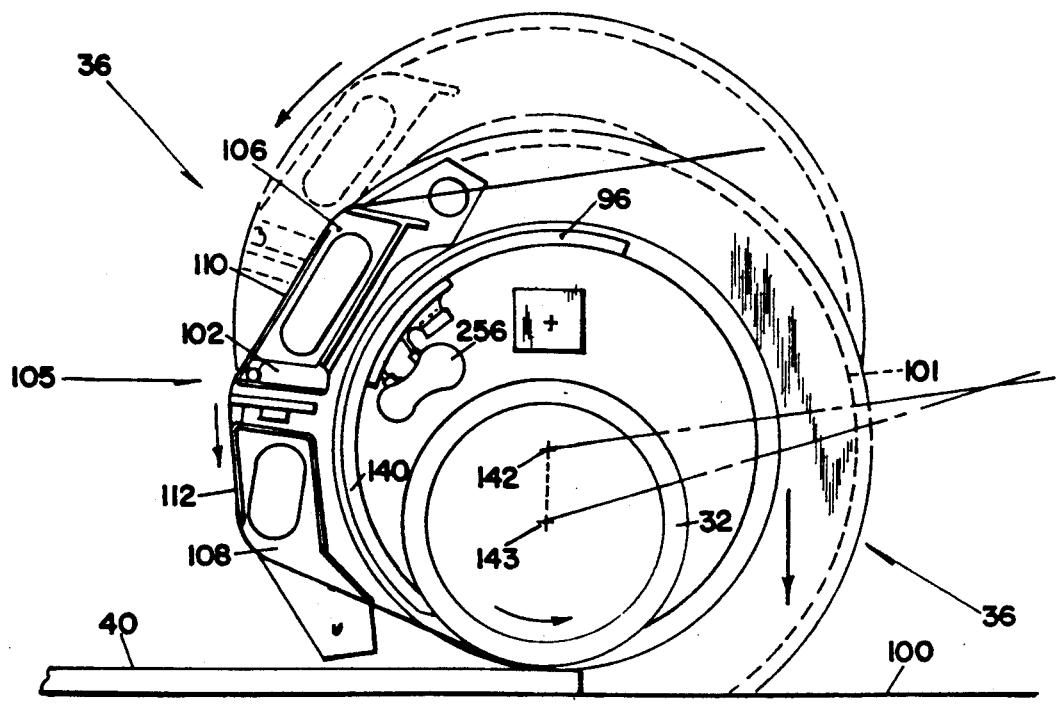
FIG. 12 illustrates the rotation of the upper tacking device and the closing of the upper lamination roll on the board at the same line position or region at which the tacking had been effected.

In the continued sequence of operation of the laminator 30, as shown in FIG. 12, with the board 40 being maintained immobile, the tacking device 36 is rotated counterclockwise to a waiting position indicated by reference number 105. The tacking device 38 is rotated clockwise to a similar waiting position.

the then leading end of the associated film web 84 or 86 to the opposite sides of the new board 40 that has arrived on the scene to be laminated.

In order to assist in the unwinding of the film webs 84 and 86 from the reels 60 and 62 and to keep the correct film tension during the tacking and laminating operations, the film feed rolls 64 and 66 and the tension rolls 80 and 82, shown in FIG. 3, are provided.

A detailed view of the assembly of the mechanism for supporting the lamination rolls 32 and 34 and the tacking/cutting devices 36 and 38 is shown in FIG. 25. As there shown, a shaft 124 extending from the left end of the upper lamination roll 32 is supported for rotation in a supporting member 126. A shaft 128 that extends from the right end of lamination roll 32 is supported for rotation in a supporting member 130. Similarly, a shaft 132 extending from the left end of lower lamination roll 34 is supported for rotation in a supporting member 134, and a shaft 136 extending from the right end of lamination roll 34 is supported for rotation in a supporting member 138.

Figure 33:
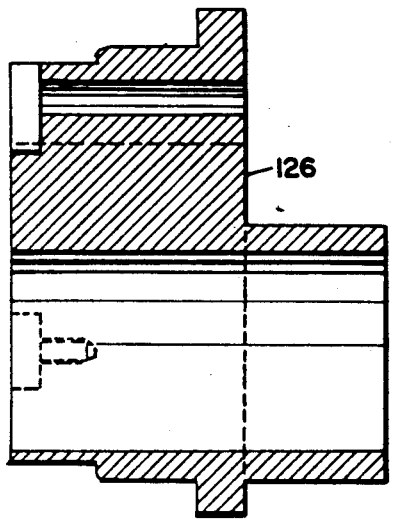
FIG. 33 is a view taken along the lines 33—33 of FIG. 32.
Figure 32:
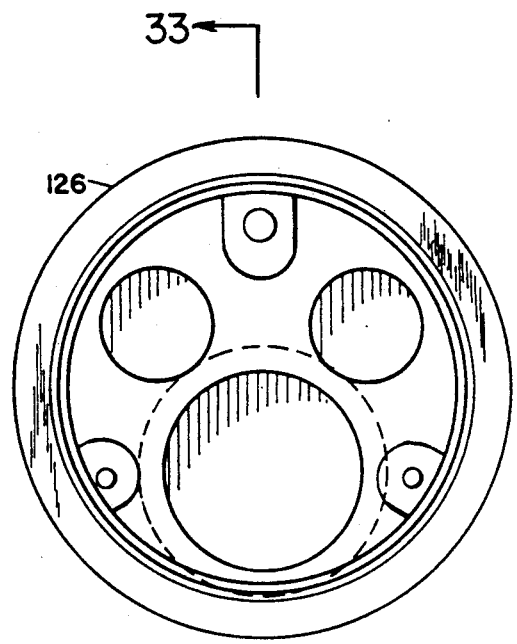
FIG. 32 is an end view of a support member provided for the left end of the upper laminating roll and for the right end of the lower laminating roll, as seen in FIG. 25.
Figure 35:
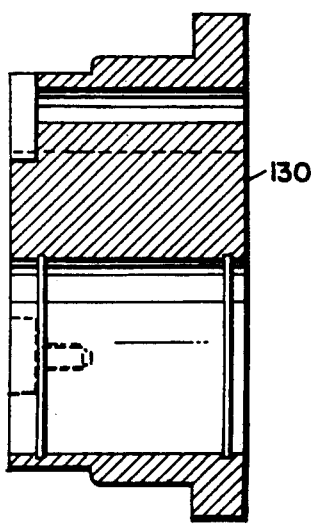
FIG. 35 is a view taken along the lines 35—35 of FIG. 34.
Figure 34:
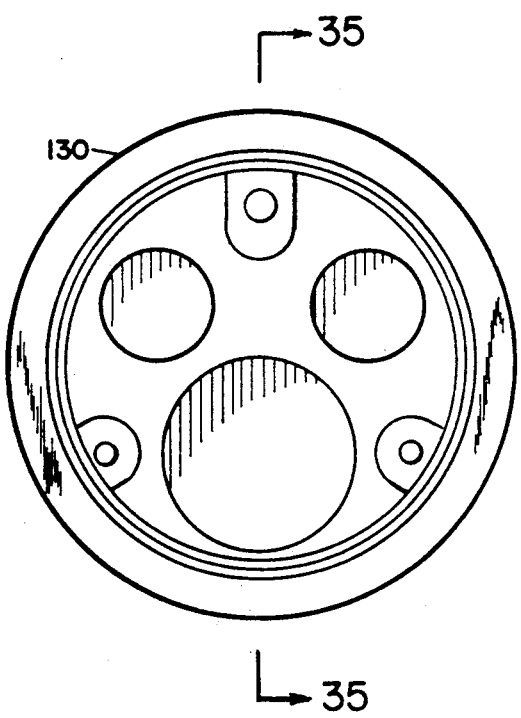
FIG. 34 is an end view of a support member provided for the right end of the upper laminating roll and for the left end of the lower laminating roll, as seen in FIG. 25.

Supporting members 126 and 138 may be identical in structure. Detail views thereof are shown in FIGS. 32 and 33. Similarly, supporting members 130 and 134 may be identical in structure with detail views thereof being shown in FIGS. 34 and 35.

Fixedly attached to and supported by the supporting members 126 and 130 and extending therebetween is a film guiding sector 140 on which the curved surface 96 previously mentioned is formed. The axis or center or curvature of sector 140 is located at 142, which as seen in FIGS. 3, 8-13 and 24, is offset from the center of rotation 143 of the lamination roll 32. A similar film guiding sector 144 is fixedly attached to and extends between the supporting members 132 and 138, the axis or center of curvature of sector 144 being located at 146, as seen in FIG. 3. The previously mentioned curved surface 98 is formed on sector 144.

Figure 46:
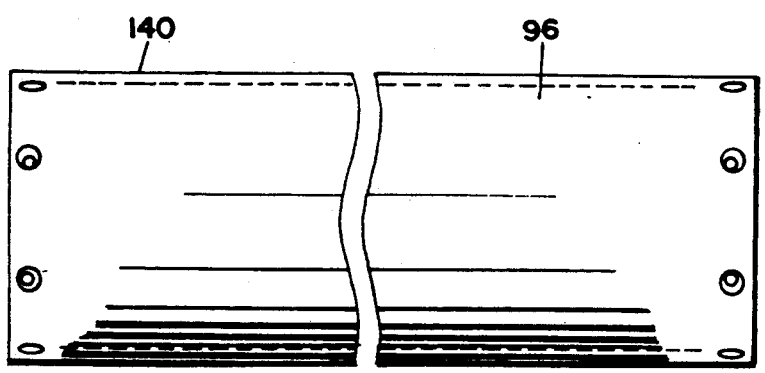
FIGS. 46 and 47 are plan and end views, respectively, of the film guiding structure.
Figure 47:
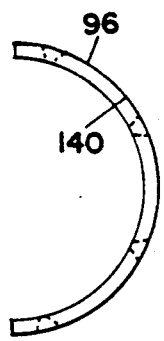

The structures of the film guiding sectors 140 and 144 may be identical, such structure being illustrated in FIGS. 46 and 47.

Figure 36:
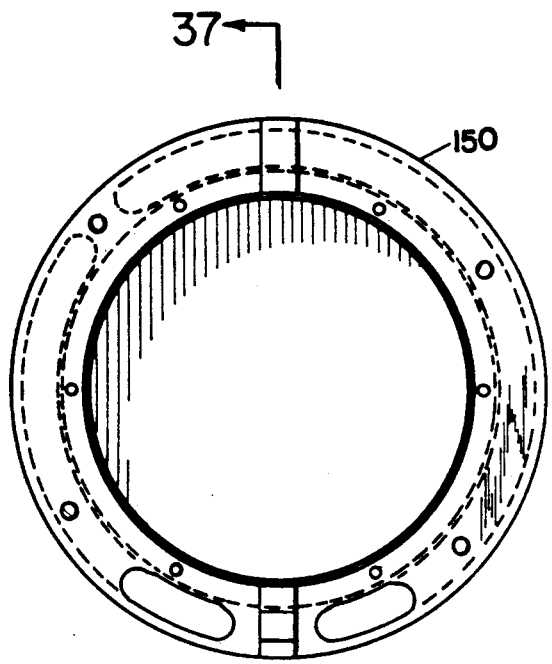
FIG. 36 is a front view of a flange that is provided for supporting each of the ends of the upper and lower tacking bars, as seen in FIG. 25.
Figure 37:
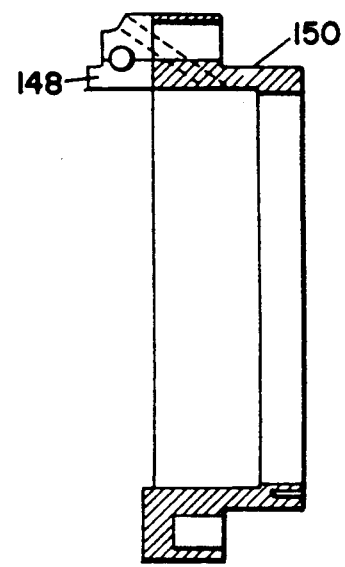
FIG. 37 is a view taken along the lines 37—37 of FIG. 36.
Figure 39:
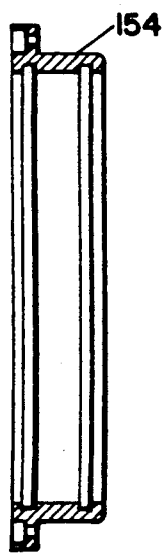
FIG. 39 is a view taken along the lines 39—39 of FIG. 38.
Figure 38:
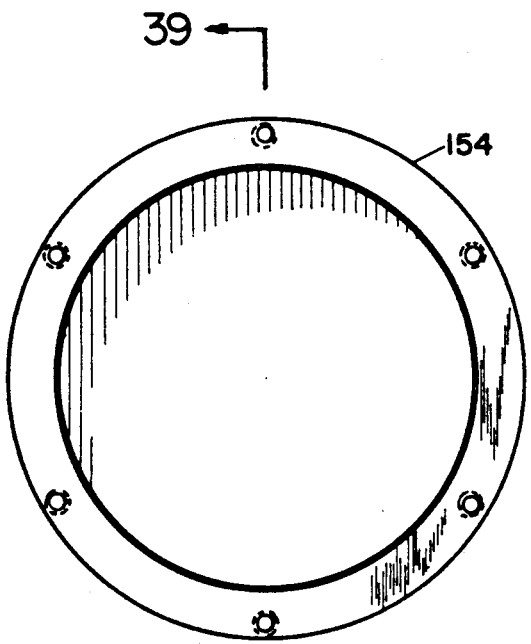
FIG. 38 is a front view of a bearing retaining flange for the upper and lower left side bearings of the tacking and laminating assembled structure, as shown in FIG. 25.

Tacking bars 102 and 104 are supported for rotation in respective paths 101 and 103 that are in eccentric relation with respect to the individually associated lamination rolls 32 and 34. Specifically, as shown in FIG. 25, the left end of the upper tacking bar 102 is fixedly attached by a tab 148 to a flange 150, the tab 148 being integral with the flange 150 as seen in FIGS. 36 and 37. Flange 150 is arranged for rotation around a peripheral surface 152 of supporting member 126. Supporting flange 150 for such rotation is a roller bearing 156 that is positioned between the inner surface 158 thereof and the surface 152 and held in that position by a bearing retaining flange 154. FIGS. 38 and 39 illustrate the flange 154 in detail.

Figure 41:
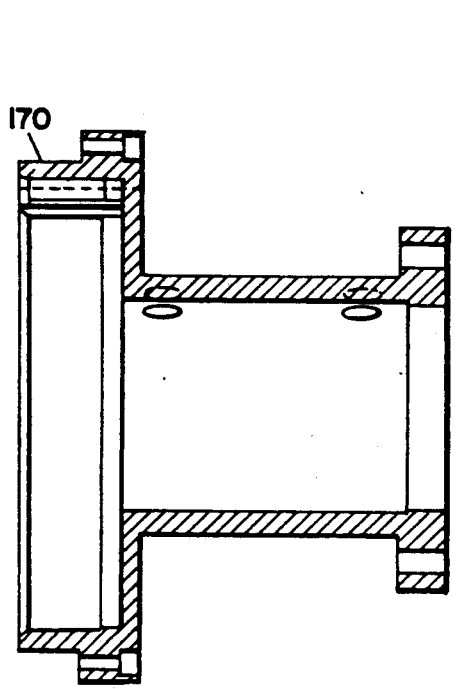
FIG. 41 is a view taken along the lines 41—41 of FIG. 40.
Figure 40:
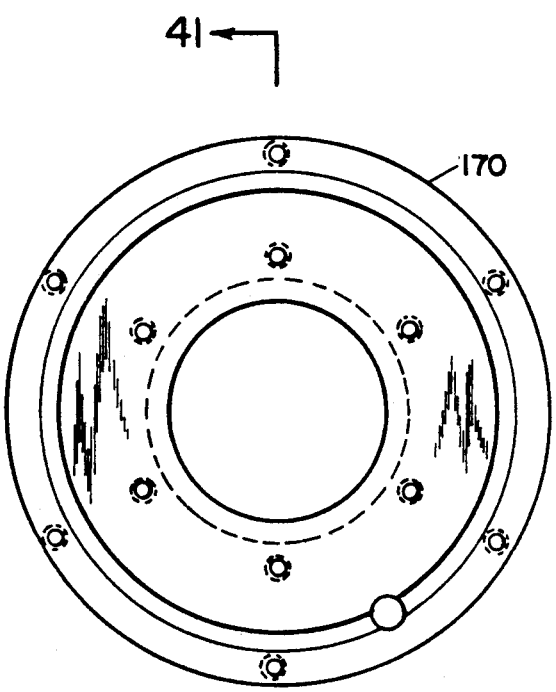
FIG. 40 is a front view of a flange for the upper right side bearings of the tacking and laminating assembled structure, as shown in FIG. 25.
Figure 44:
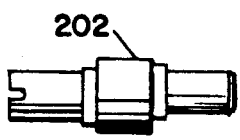
FIGS. 44 and 45 are plan and end views, respectively, of an eccentric pivot employed for the ball bearings in FIG. 25.
Figure 45:

Similarly, the right end of tacking bar 102 is fixedly attached by a tab 160 to a flange 162, the tab 160 being integral with the flange 162. Supporting flange 162 for rotation about a peripheral surface 164 of supporting member 130 is a roller bearing 166. Roller bearing 166 is positioned between the surface 164 and the inner surface 168 of flange 162 and is held therebetween by bearing retaining flange 170. Detail views of the bearing retaining flange 170 are shown in FIGS. 40 and 41.

The left end of the lower tacking bar 104 is fixedly attached by a tab 172 to a flange 174. Tab 172 is integral with the flange 174, as shown in FIGS. 36 and 37. Flange 174 is supported for rotation about the peripheral surface 176 of supporting member 134, a roller bearing 178 being positioned between the surface 176 and an inner surface 180 of flange 174 and held therein by a bearing retaining flange 182. A detail of flange 182 is shown in FIGS. 38 and 39.

Figures 42, 43:
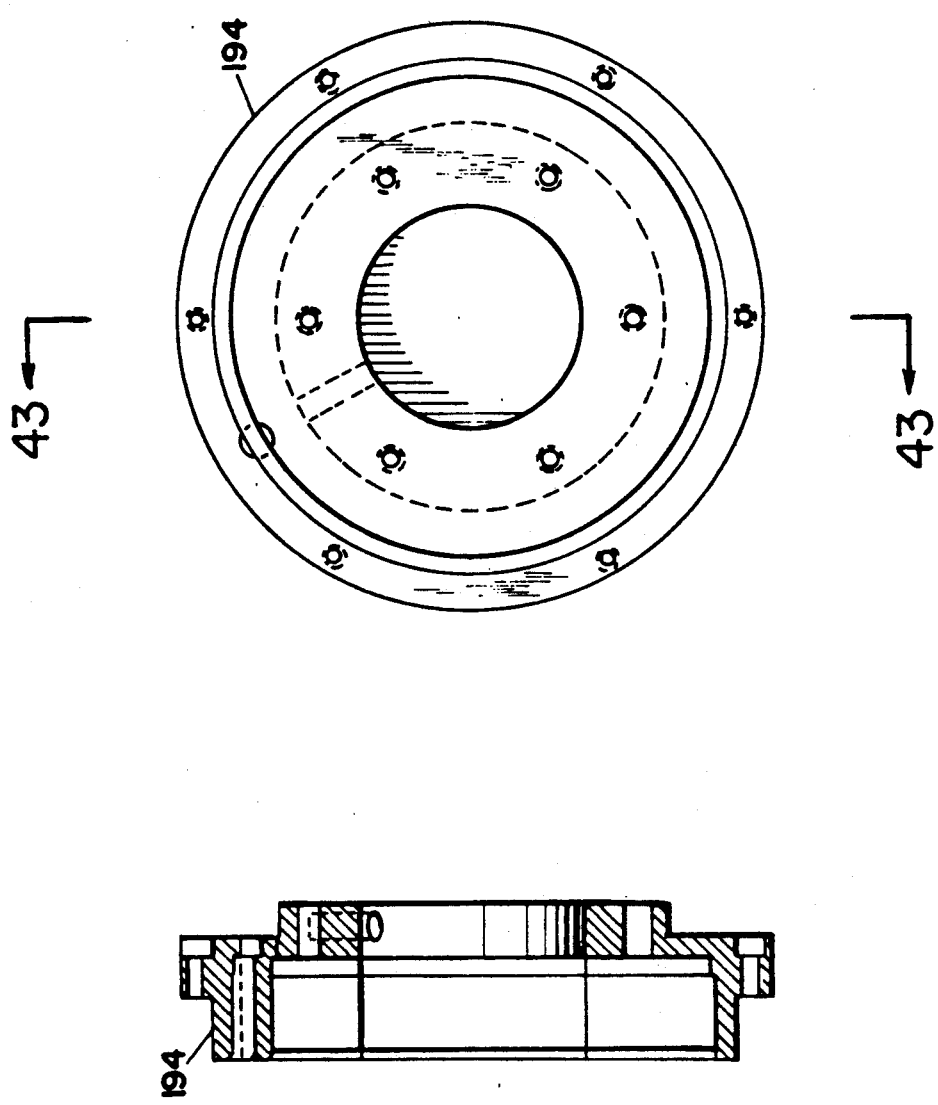
FIG. 42 is a front view of a flange for the lower right side bearing of the tacking and laminating structure, as shown in FIG. 25.
FIG. 43 is a view taken along the lines 43—43 of FIG. 42.

The right end of the tacking bar 104 is fixedly attached by a tab 184 to a flange 186, the tab 184 being integral with the flange 186. Flange 186 is supported for rotation about the peripheral surface 188 of supporting member 138. A roller bearing 190 is positioned between the surface 188 of member 138 and in inner surface 192 of flange 186 and is held therein by a bearing retaining flange 194. Detailed views of flange 194 are shown in FIGS. 42 and 43.

Figure 26:
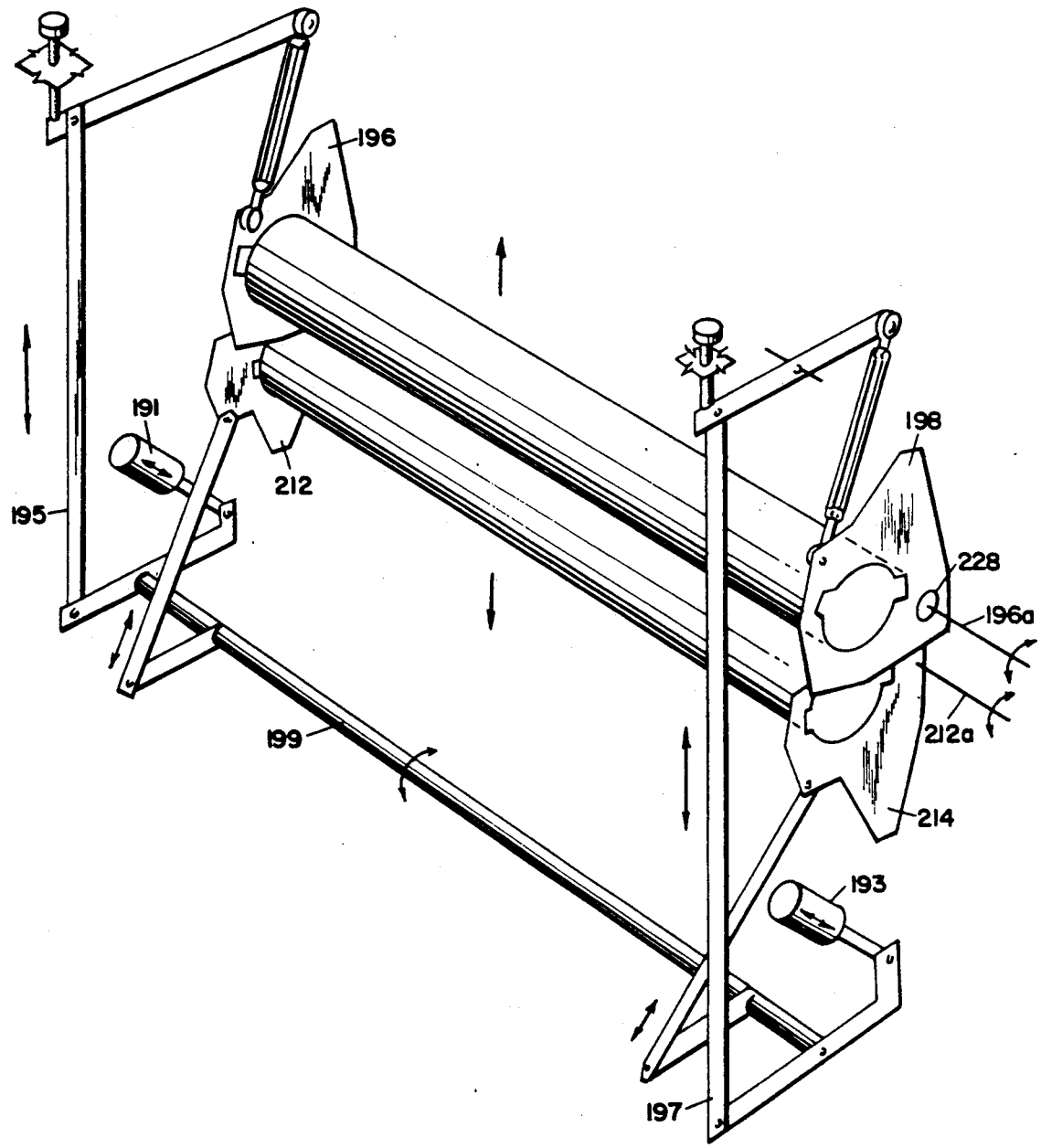
FIG. 26 is a schematic perspective view of mechanism provided in the laminator for opening and closing the laminating rolls.

Two cylinders 191 and 193 (one at the left and one at the right of the machine, as schematically illustrated in FIG. 26) are provided for moving parallel lever systems 195 and 197. The lever systems 195 and 197 are mechanically coupled by means of a shaft 199 so that operation of the cylinders 191 and 193 effect the same movement on the left and right sides of the laminating machine.

Figure 27:
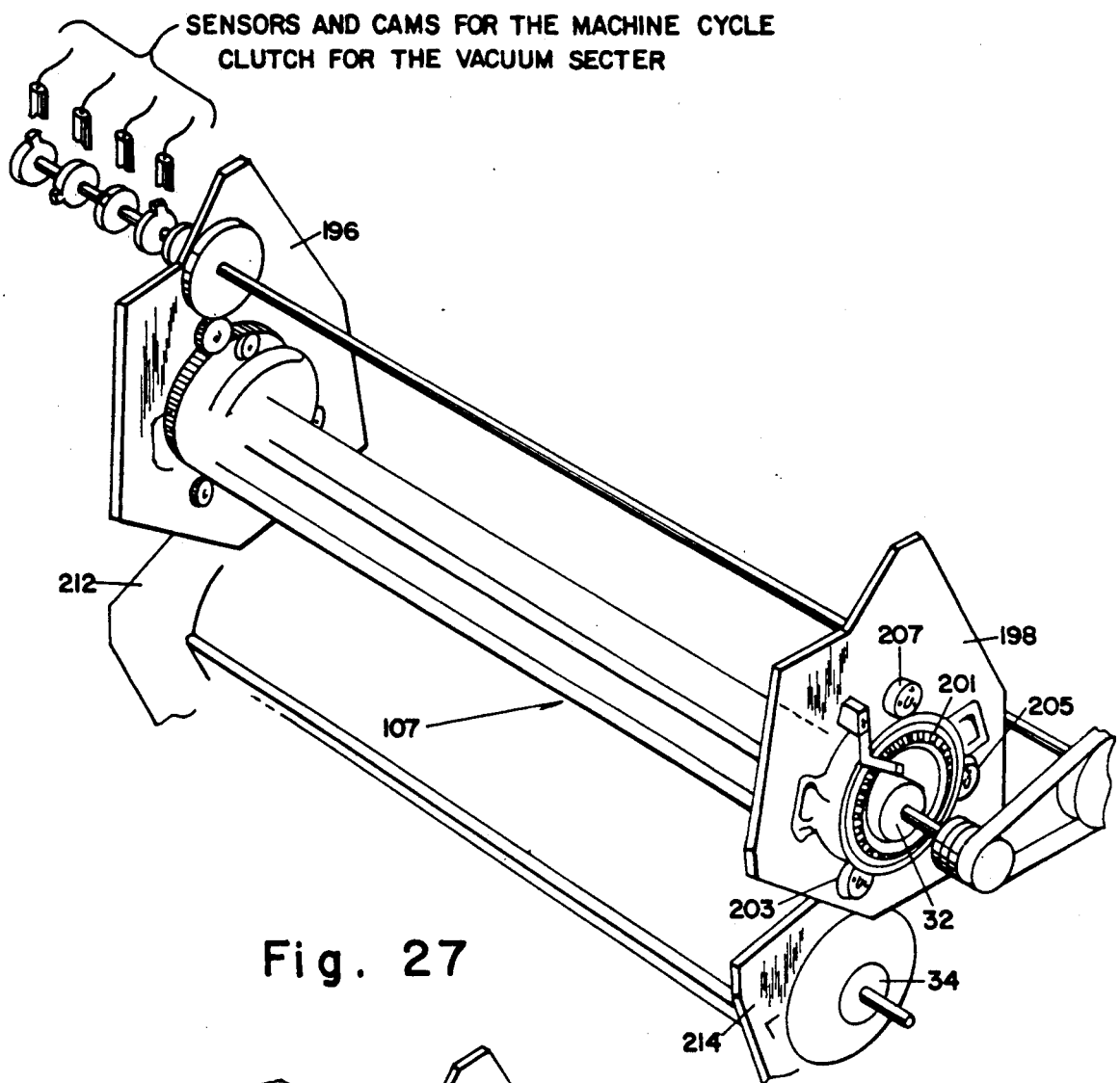
FIG. 27 is a schematic perspective view of mechanism provided for effecting rotation of the vacuum sectors and of the laminating rolls.
Figure 28:
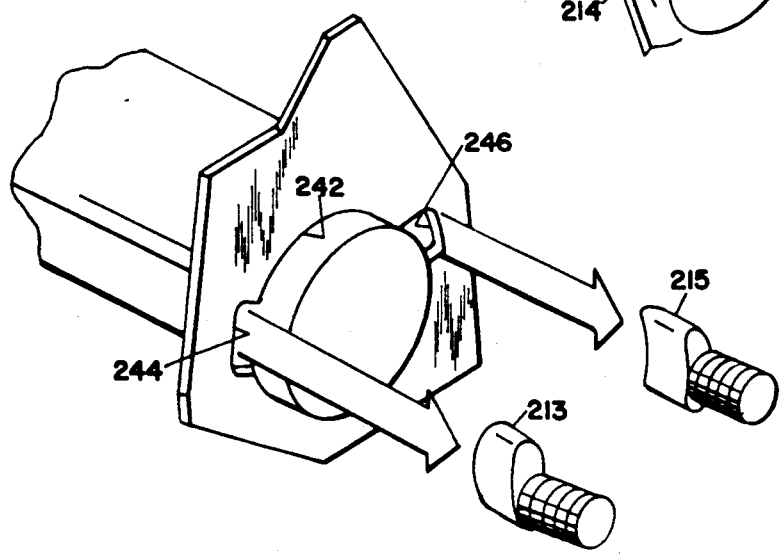
FIG. 28 is a schematic perspective view of the air intake for the vacuum sectors.
Figure 30:
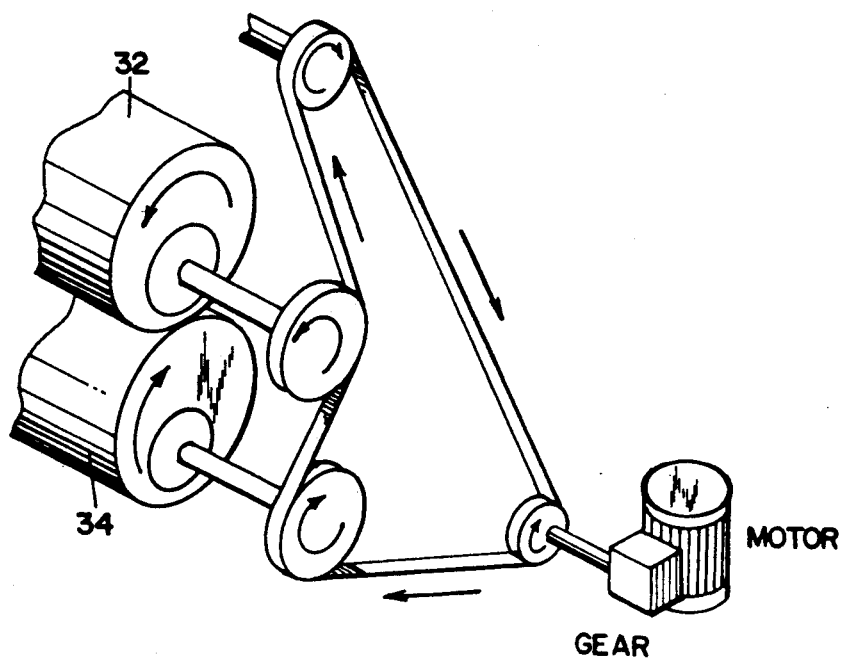
FIG. 30 is a schematic fragmented perspective view of a drive mechanism transmitting clockwise and counterclockwise motion to the laminating rolls.

The lever systems 195 and 197 rock, that is, drive into and out of the plane of the paper, as seen in FIG. 26, the respective pairs of shoulders 196, 198 and 212, 214. The pairs of shoulders 196, 198 and 212, 214 are pivoted for such rotation on centers of rotation indicated at 196a and 212a, respectively, with the shoulders 196, 198 being arranged to support the upper lamination roll 32 and the shoulders 212 and 214 arranged to support the lower lamination roll 34, as shown in FIG. 27. One central bearing 201 and three peripheric bearings 203, 205 and 207 are provided for the eccentric rotation of the vacuum sector 107, the peripheric bearing 207 being provided with an eccentric adjustment. The vacuum rotating sector 107 carries the tacking bar 102 and counterblade 121.

The two upper shoulders 196 and 198 are laterally separated with respect to the lower shoulders 212 and 214, as shown in FIGS. 25, 26 and 27, so that the lamination rolls 32 and 34 can be pressed one against the other.

In the operation of the laminator 30, upon initial movement of the tacking/cutting devices 36 and 38 toward the plane 100 the respectively associated tacking bar 102 and 104 is positioned to tack the leading end of an associated film web 84 and 86 against the opposite sides of a board 40. Upon movement of the tacking/cutting devices 36 and 38 away form the plane 100, the tacking/cutting devices 36 and 38 are rotated counterclockwise and clockwise, respectively, to waiting positions as illustrated at 105 in FIGS. 12, 13, and 14. Subsequent movements of the tacking/cutting devices 36 and 38 toward the plane 100 thus allow the respectively associated laminating roll 32 and 34 to make contact with the film web on the precise line at which it had been tacked to a board 40, following which contact lamination of the respective film web 84 and 86 to the board 40 is enabled.

Electromagnetic coupling devices 248 and 250, as shown in FIGS. 50 and 51, are provided for controlling the selective actuation of the tacking/cutting devices 36 and 38 for rotation. Two coupling devices (not shown) are provided to stop the laminating rolls 32 and 34 when they are closed and the eccentric sectors are rotating to the rest position. Coupling devices 252 and 254 are provided to start and stop the film feed rolls 64 and 66.

Figure 31:
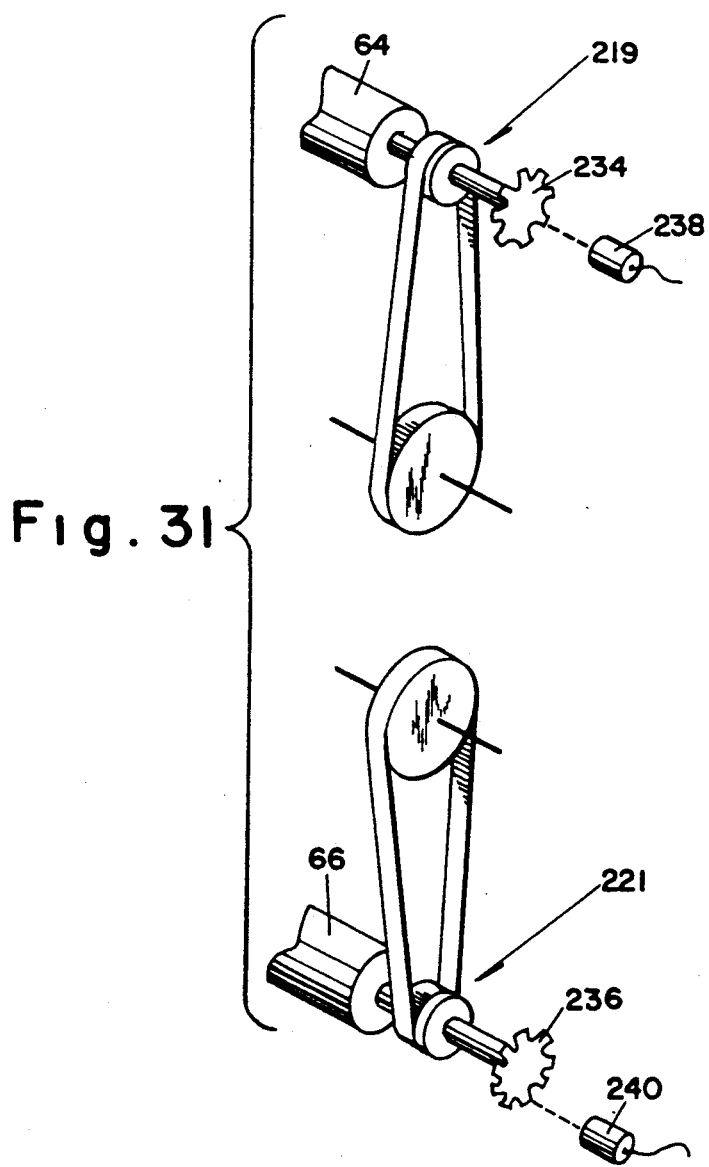
FIG. 31 is a schematic fragmented perspective view of mechanism for effecting control of the film feed rolls.
Figure 29:
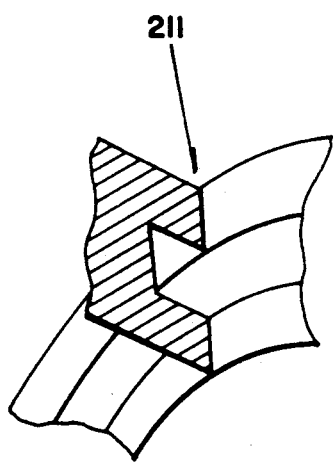
FIG. 29 is a schematic fragmented perspective view of the air intake from the rotating vacuum sectors.

Electromagnetic coupling devices 219 and 221, as shown in FIG. 31, are provided for controlling the film feed rolls 64 and 66. Also provided are notched wheels 234 and 236 which rotate with the film feed rolls 64 and 66, respectively. Proximity switches 238 and 240 individually associated, respectively, with the notched wheels 223 and 225 are provided for sounding an alarm system (not shown) to signal the end of the film and any missed cut.

Heating of the lamination rolls is effected, in accordance with the invention, by infra red lamps that are externally positioned with respect to the laminating rolls 32 and 34. Thus, as shown in FIGS. 8–13, an infra red lamp 256, that is suitably supported by brackets 258 and 260 attached to the inner wall of the film guiding sector 140 is provided for heating the lamination roll 32. A similarly positioned and mounted infra red lamp is provided for heating the lamination roll 34. Preferably, the infra red lamps employed are of the so-called short wave type. In one embodiment of the invention the infra red lamps each have an output of 4200 watts.

For controlling the temperature of each of the laminating rolls 32 and 34, there is provided a separate suitably mounted temperature detector for each said roll, which detector is characterized by the capacity thereof to measure the temperature at the peripheral surface of a laminating roll without the introduction of friction and consequent damage thereto and independently of the heat color of the roll surface. Specifically, a temperature detector 262 provided in association with lamination roll 32 comprises a contacting, or more specifically, a rolling type iron-constantan thermocouple 273. Thermocouple 273 is disposed with the hot junction 264 thereof in a hollow sleeve 266 at a position that is coincident with the axis of rotation thereof.

More specifically, the temperature detector 262 comprises an elongated bifurcated support 268 of thermoplastic polyester, reinforced with glass fiber which carries a tubular steel pin 270 between the branches thereof with the Iron-constanton thermocouple 273 positioned in the pin 270. One end of steel pin 270 is wrapped around the side of the support 268, as shown, being lodged and retained in a groove 271. The thermocouple 273 extends into the interior of the steel pin 270 through the other end thereof. The roller bearing 266, which preferably is made of a material having high thermal conductivity such as copper, with a thin lining or bushing 272 made of thermoplastic polyester reinforced with glass fiber, rotates on the steel pin 270.

The copper bearing 266 is positioned in rolling contact with the peripheral surface of the laminating roll 32. As a result, the bearing 266 assumes the peripheric speed and temperature of the lamination roll 32.

With this arrangement, the hot junction of the thermocouple 273 assumes substantially the same temperature as that of the lamination roll 32. The difference in temperature, if any, is negligible due to the high thermal conductivity of the copper in the bearing 266 and the thinness of both the bushing 272 and the wall of the tubular pin 270.

As a result, the temperature detector 262 detects the contact temperature of the surface of the rotating lamination roll 32 in a substantially friction free manner independently of the heat color of the surface.

Wearing of the temperature detector 262 is very low, being of the order of 0.03 millimeters per 1000 hours at 3 mts./min. due to the high lubricating properties of the thermoplastic polyester reinforced with glass fiber. It is noted that this material is available commercially from "Schuely" (Nederlan) under the trademark "ARNITE."

In accordance with the invention, a microprocessor is provided in cooperation with the temperature detector 262 for effecting automatic adjustment in the heating level of the infrared lamps and thereby of the temperature of the lamination rolls 32 and 34 depending upon the lamination speed, the thickness of the boards or panels to be laminated, and the pressure of the lamination rolls in order to maintain constant the exit temperature of the laminated boards or panels.

The automatic centering device 48 to which reference has been made hereinbefore and which is shown in FIG. 4 is driven by a direct current low inertia reversible motor 274 and is controlled by a servocontrol 276 which, in turn, is controlled by a Programmable Logic Controller (PLC) 280 that is housed in a mobile electronic control cabinet 282, as shown in FIG. 55. The motor 274 drives a screw 284 for adjusting the lateral positions of spaced parallel edges 286 and 288 between which each panel 40 is advanced by the input conveyor means 44 of the laminator 30.

A panel 40, advanced by the input conveyor 44, intercepts the light beam of a mirror photocell. This photocell further includes one infrared beam emitter 294 and one receiver 296. A modulated infrared beam emitted by 294 reaches the receiver 296 by a series of reflections on the mirrors, thus forming a net of beam segments. When the panel 40 intercepts one of these beam segments, the receiver 296 signals to the servocontrol 276 that a panel is under the mirrors. The motor 274 is energized and rotates in the direction that closes the parallel edges to center the panel.

When the two parallel edges 286 and 288 close toward the center, the photocells 298 and 300, one of which is located 1 cm. over the edge 286 and the other 1 cm. over the edge 288 and both of which are connected to the servocontrol 276, detect the panel. Sensing of the panel 40 by both photocells 298 and 300 results in a decrease in the energization of the motor 274 for rotation and consequent slowing down thereof.

With continued advance of the two parallel edges at low speed, panel 40 moves into the sensing path of "stop photocells" 302 and 304, which are carried 1 mm. over the edge of 286 and 288 and also are connected to the servocontrol 276. When the panel 40 is sensed by both the photocells 302 and 304, the energization of the motor 274 is discontinued and the motor 274 stops immediately with the panel 40 properly centered. After a delay of a few seconds, the motor 274 is energized for rotation in the opposite direction and opens the parallel edges 286 and 288.

It is noted that the centering device 48 is characterized by a precision of operation that enables boards or panels having a thickness as small as 0.002 inches (0.05 mm.) to be centered without causing any damage thereto.

Figure 13:
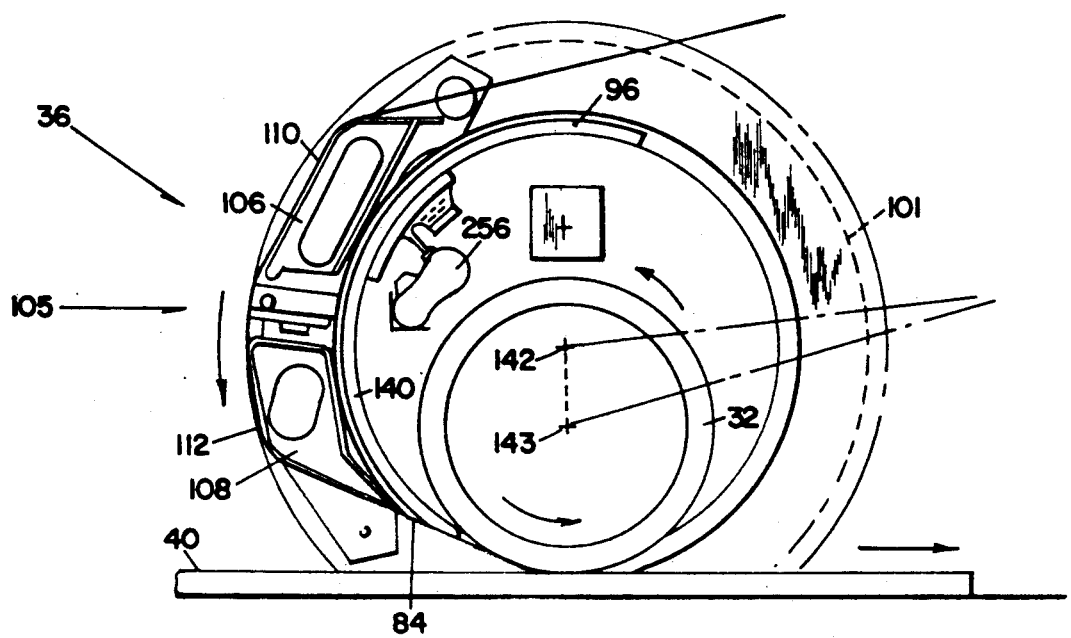
FIG. 13 illustrates the lamination by the upper lamination roll of the film of photopolymer resist material to the board.

In accordance with the invention the main body 42 of the laminator 30 may be completely enclosed in a cabinet 306, as illustrated in FIG. 55, and include in association therewith the aforementioned mobile cabinet 282 in which electronic controls for the laminator 30 may be housed. The mobile cabinet 282 includes the PLC unit 280 previously mentioned, which unit may comprise a LANDIS and GYR with serial line RS232. The mobile cabinet 282 may also contain a microprocessor with intelligent peripherals such as the previously mentioned temperature controller, motor controls, etc., and further includes a video display unit to interface the opera- In rotating from the tacking position to the waiting position 105 shown for the tacking device 36, the contacting surfaces 112 and 110 associated respectively with the vacuum shoes 108 and 106 engage the film web 84 and lift it off the curved film guiding surface 96. The contacting surfaces associated with the vacuum devices 116 and 114 of tacking device 38 similarly engage the film web 86 and lift it off its associated curved film guiding surface 98. At the same time each of the lamination rolls 32 and 34 is moved to close on the board 40 at the same line position or region across the width of the respectively associated film web 84 and 86 where the tacking had been effected. The lamination rolls 32 and 34 press the associated film webs 84 and 86 against the opposite surfaces of the board 40, and advance the board 40 therebetween. With the tension rolls 80 and 82 applying tension to the film webs 84 and 86, respectively, the laminating rolls 32 and 34 start to laminate the film webs 84 and 86 thereto, as illustrated in FIG. 13, at a speed, temperature and pressure that may be preset.

Thus, in the operation of the laminator 30, the contacting surface 102a of the tacking bar 102 and an upper forward portion of the board 40 form a first pair of relatively converging surfaces for tacking the leading end of the film web 84 to the board with the surface of the laminating roll 32 and the upper forward portion of the board 40 forming a second pair of relatively converging surfaces. Similarly, the contacting surface 104a of the tacking bar 104 and a lower forward portion of the board 40 form another pair of relatively converging surfaces, which for convenience, is termed hereinafter a third pair of relatively converging surfaces with a fourth pair of relatively converging surfaces being formed by the laminating roll 34 and the lower forward portion of the board 40.

Figure 14:
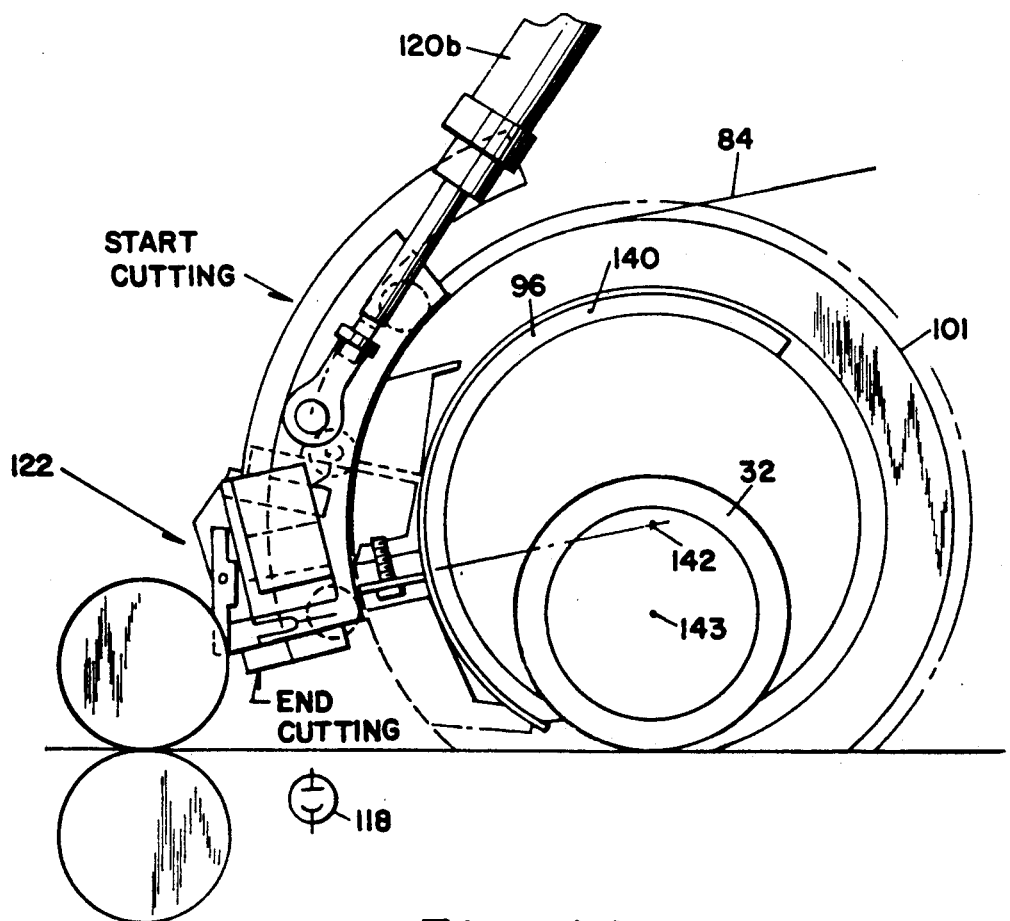
FIG. 14 is a view illustrating the transverse cutting of the film by the upper eccentric tacking/cutting device.
Figure 15:
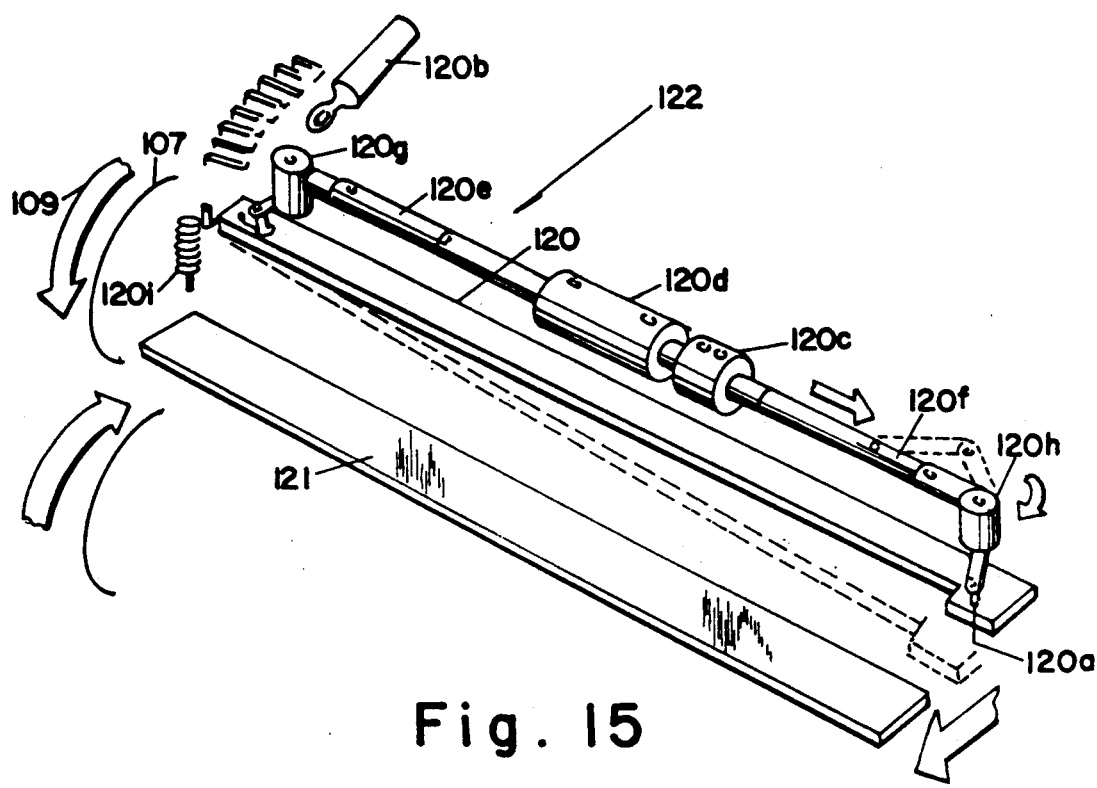
FIG. 15 is a fragmented perspective view illustrating the rest condition and coupling of the film transverse cutting system.

When the end of the board 40 being laminated is detected, as by means of photocell 118 as illustrated in FIG. 14, the tacking/cutting devices 36 and 38 begin revolving around the respectively associated lamination roll 32 and 34 toward the tacking position at a speed that is the same as that of the associated film webs 84 and 86. At the same time, an individually associated movable cutting blade 120 of the shears type, as shown in FIG. 15, is actuated to sever the continuous length of each of the film webs 84 and 86 to form film sheets of such length as to fit or match the length of the board 40 to which the film sheets are being laminated. In effecting such cutting, the movable cutting blade 120 cooperates with a fixed cutting blade or counterblade 121 that is fixedly positioned adjacent the tacking bar 102. The fixed blade 121 is sometimes referred to hereinafter as the counterblade and the blade 120 as the movable blade. The cutting action, as shown in FIG. 14, starts at the positioned designated "START CUTTING" and ends at the position designated "END CUTTING." The cutting blade 120 is advanced at a speed that is the same as that of the film 84 along a path that is that same as that of the tacking bar 102 and fixed cutting blade 121.

The cutting system includes a mechanism for effecting the coupling of the movable cutting blade and the counterblade for cutting operation for each of the tacking/cutting devices 36 and 38 and for effecting such operation.

The complete cutting unit for the tacking/cutting device 36, indicated by the reference numeral 122 in FIG. 15, rotates around the upper lamination roll 32 during the film cutting operation, and follows the movement of the film 84. While the tacking/cutting device for only the tacking/cutting unit 36 is described herein, it will be understood that the cutting unit for the tacking/cutting device 38 may be substantially identical to the cutting unit 122.

The fixed blade 121 is mounted on the rotatable vacuum sector 107, in close contact with the tacking bar 102, and is rotatable with the vacuum shoe 106 through a complete revolution, that is, through 360°, as indicated by the arrow 109 in FIG. 15.

Figure 16:
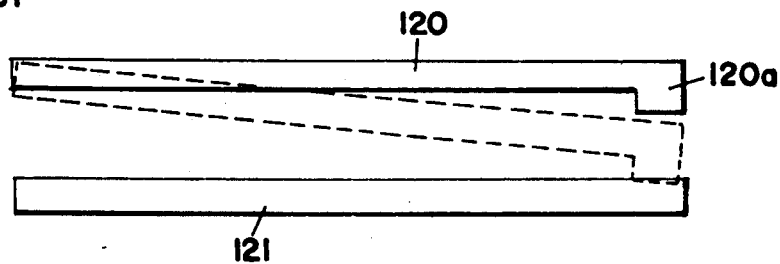
FIG. 16 is a top view showing the relationship of the movable and fixed or counter film cutting blades in the rest condition.
Figure 17:
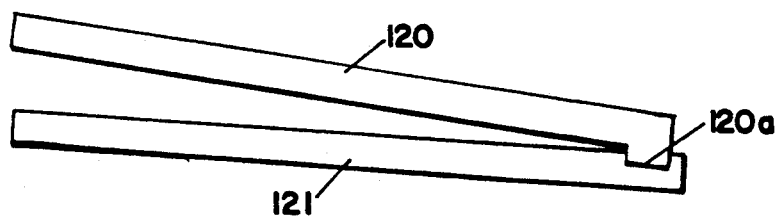
FIG. 17 is a top view showing the relationship of the movable and counter blades in the coupled condition.
Figure 18:
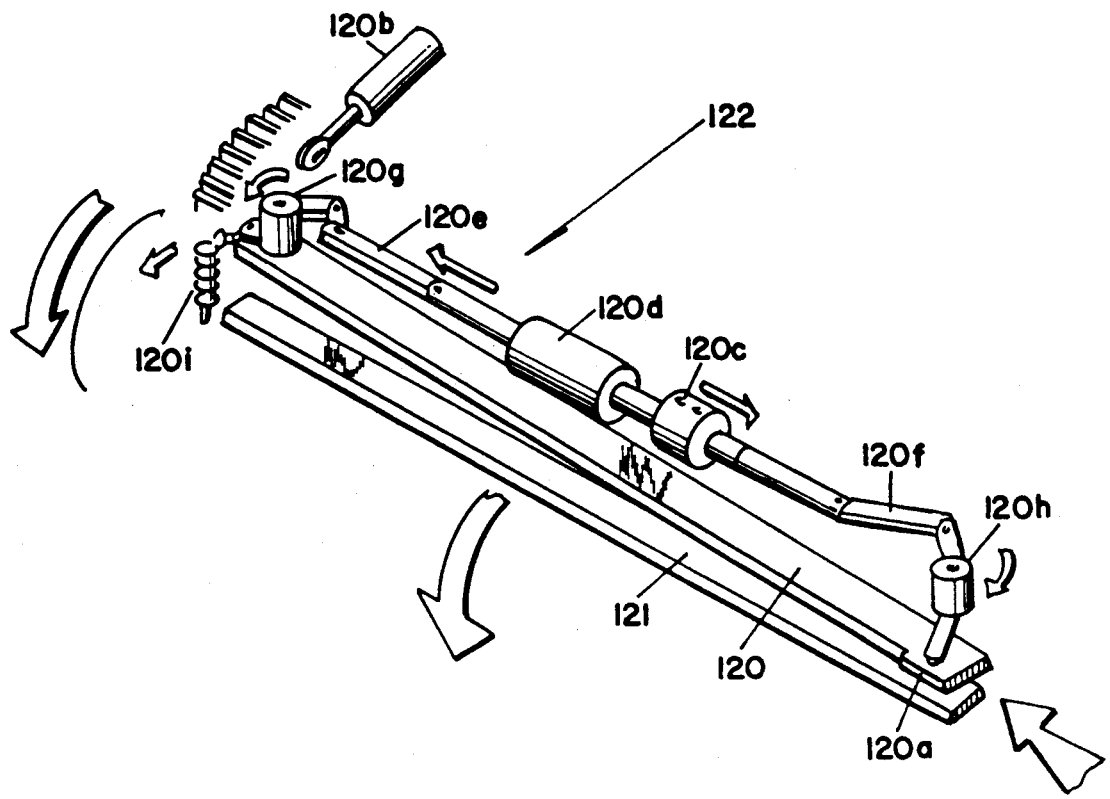
FIG. 18 is a fragmented perspective view illustrating the film cutting system at the start of cutting after coupling.
Figure 19:
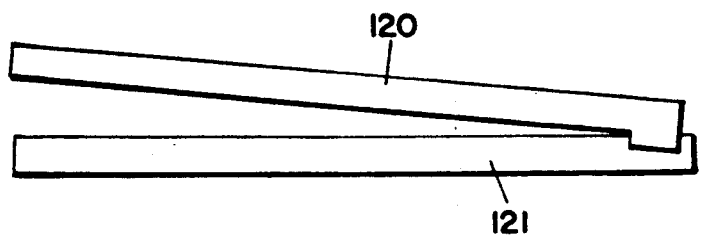
FIG. 19 is a top view showing the relationship of the cutting blades at the start of cutting.
Figure 20:
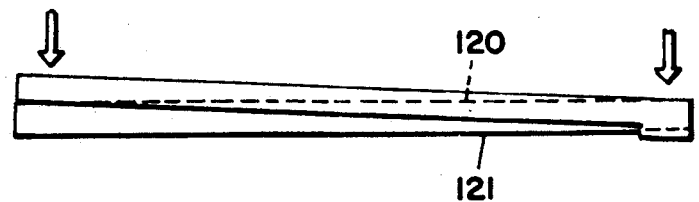
FIG. 20 is a top view showing the relationship of the cutting blades at the completion of the cutting.

The movable blade 120 is straight and is provided with a 5 mm. cog 120a at a first end. Blade 120 is kept in the rest position shown in FIGS. 15 and 16 by a contrast cylinder 120b which supports the blade moving mechanism to which it is connected. When the rotating sector 107 has completed the tacking operation and has been moved to a rest position, the movable blade 120 is moved angularly into a diagonal position by cylinder 120c so that the cog 120a protrudes. This diagonal position is indicated by the dotted lines in FIGS. 15 and 16.

When the rotating sector 107 receives a command from the PLC to rotate, to follow the film 84 and to effect the transverse cutting thereof, the counterblade 121 is moved against the cog 120a with the result that the two blades 120 and 121 are moved along together.

The contrast cylinder 120b does not have enough force to preclude the movement of the rotating sector 107, but it keeps the movable blade 120 and the counterblade 121 closely coupled to each other.

As soon as the movable blade 120 and the counterblade 121 are coupled, a cylinder 120d having a double stem actuates levers 120e and 120f. The levers 120e and 120f, by means of cams 120g and 120h, push the movable blade 120 at both ends thereof with the result that the film 84 is cut, the film 84 being positioned between the movable blade 120 and the counterblade 121.

In order to ensure that the movable blade 120 is always in close contact with the counterblade 121, a spring 120i has been provided.

Figure 21:
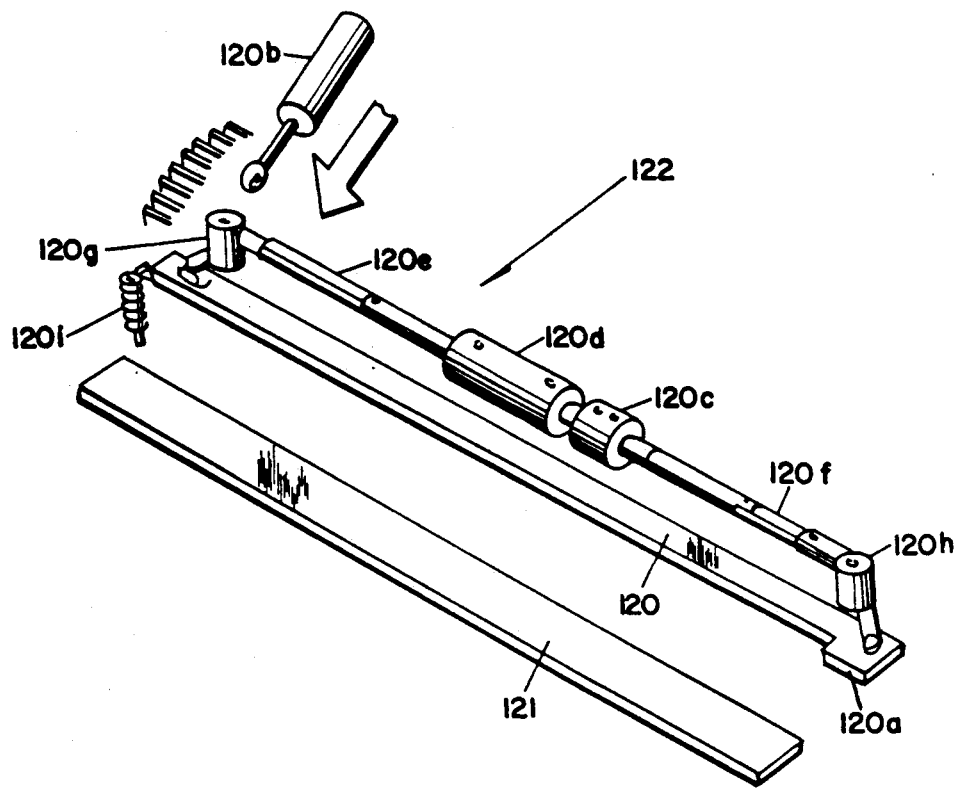
FIG. 21 is a fragmented perspective view showing the release of the movable blade from the fixed blade.
Figure 22:
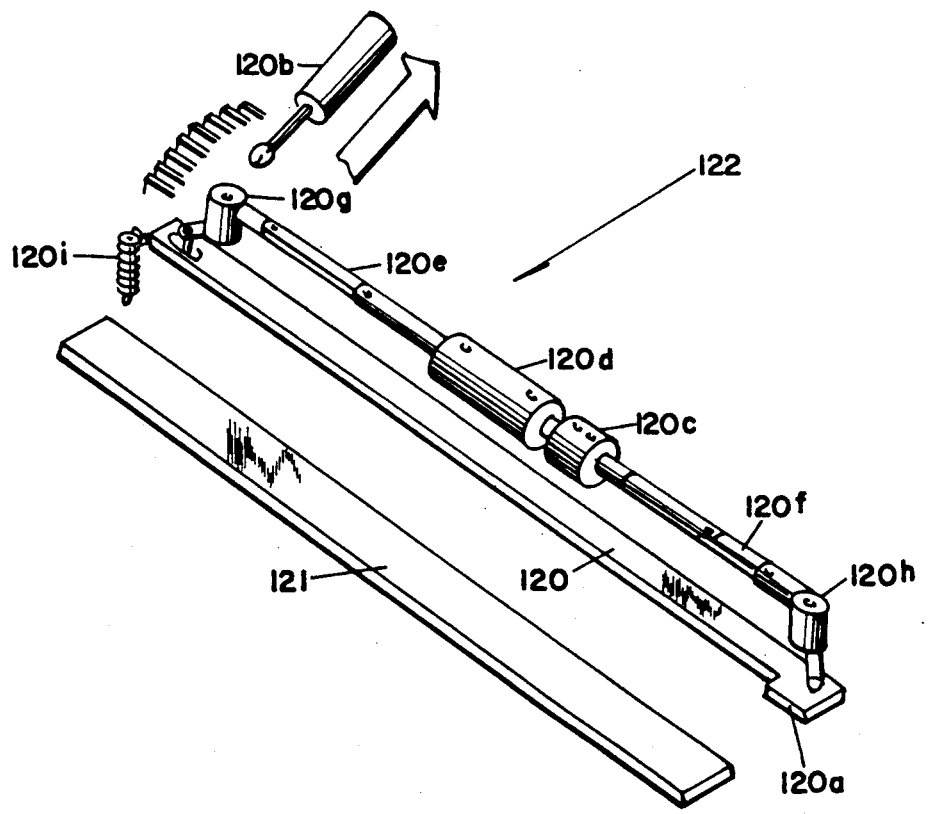
FIG. 22 is a fragmented perspective view showing the return to the rest position of the moving unit of the cutting system.
Figure 23:
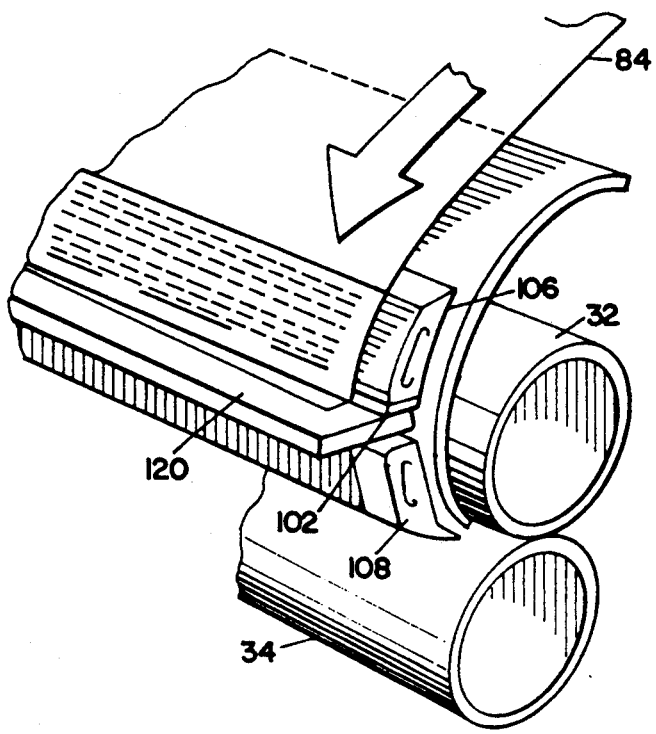
FIG. 23 is a fragmental perspective view of the film cutting.

After the cutting of the film has been completed, the rotating sector 107 and the coupled movable blade 120 and counterblade 121 stop. The contrast cylinder 120b is actuated in the same direction as the previous rotation so that the coupling cog 120a of the movable blade 120 is released from the counterblade 121, as shown in FIG. 21. The two cylinders 120c and 120d are then reset and the movable blade 120 is returned to the rest position thereof together with the attached coupling cog 120a. At this time, the contrast cylinder 120b is reset and the movable mechanism 122 together with the movable blade 120 is returned to the rest position, as shown in FIG. 22.

The severing of the film webs 84 and 86 is made in 0.3 of a second. The cutting operation is completed when the tacking/cutting devices 36 and 38 have been revolved approximately half the distance between the waiting position 105 and the tacking position. After being severed, the trailing end of each film sheet is held away from the board 40 being laminated by the associated vacuum shoe 108 and 116, thereby avoiding any tendency for the film sheet to wrinkle while the lamination thereof continues.

Figure 24:
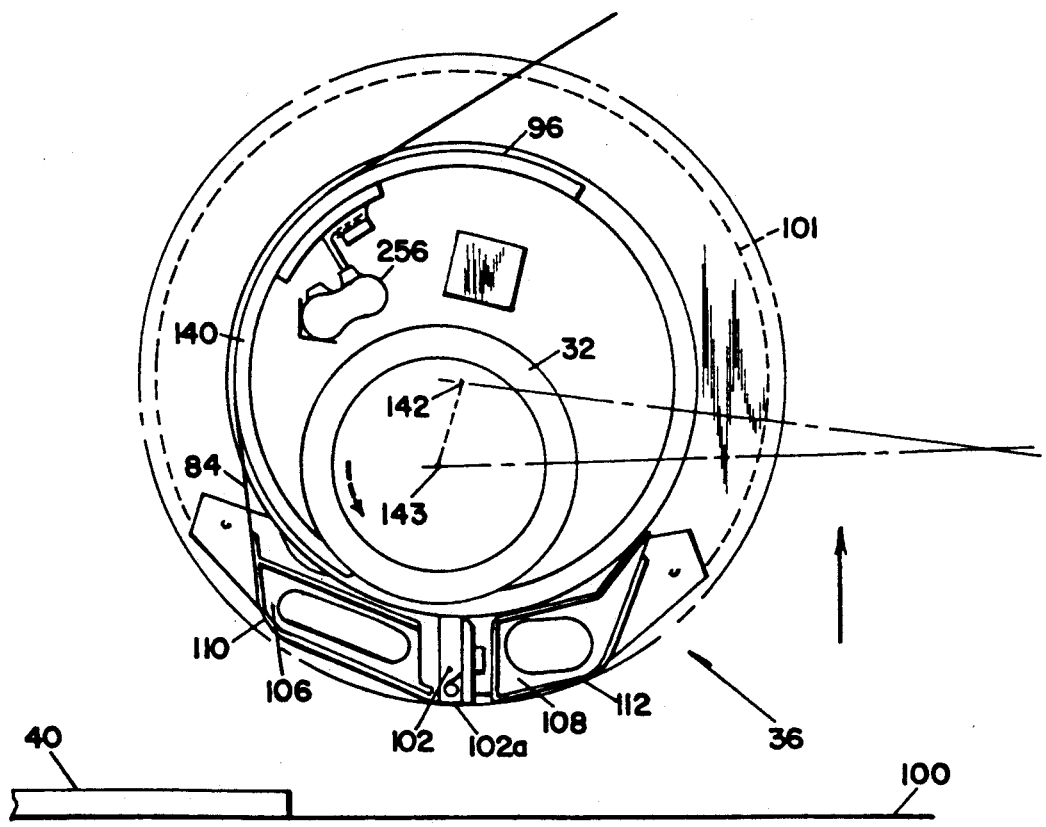
FIG. 24 illustrates the return of the upper tacking device and laminating roll to the correct position just in time to effect the tacking of the next board, following in sequence to be laminated.

As soon as the lamination is completed, as shown in FIG. 24, the lamination rolls 32 and 34 are set apart with the two eccentric tacking/cutting devices 36 and 38 being simultaneously revolved to the tacking positions thereof just in time to be in the correct positions to tack tor for diagnostic purposes and control of process parameters.

The electronic controls provided in the mobile cabinet 282 enable a high degree of flexibility in operation. Thus, the system is adaptable to automatic, manual, and single stroke operation. An alarm system signals any missed cut, the end of film, missed lamination, and/or output conveyor busy. Additionally, an alarm is given and diagnostic analysis provided for any fault in operation.

Input and output roller tables for conveying the boards to be laminated are provided with adjustable height, independent motor and synchronized speed. The input table is fitted with a centering device and gripping system, as described, for feeding the boards to the lamination rolls. The output table carries temperature sensors to measure the temperature of the boards and photocells to detect jamming of the boards.

The invention enables the achievement of a highly efficient lamination operation, with tacking and cutting being in no way critical.

With this description of the invention in detail, those skilled in the art will appreciate that modifications may be made to the invention without departing from the spirit thereof. Therefore, it is not intended that the scope of the present invention be limited to the specific embodiments illustrated and described. Rather, it is intended that the scope of the invention be determined by the scope of the appended claims.

What is claimed is:

1. A temperature detector for measuring the temperature of a moving surface comprising,
    an elongated bifurcated support member having first and second sides with the branches thereof having forward edge portions,
    a hollow pin extending between and supported by the said forward edge portions of said branches of said support member, said hollow pin having a first end wrapped around said first side of said support member and retained in a groove therein and having a second end terminating at said second side of said support member,
    a hollow sleeve bearing positioned for rotation on said hollow pin between the branches of said support member,
    a bushing for said hollow sleeve bearing comprising a thin layer of thermoplastic polyester reinforced with glass fiber, and
    a thermocouple extending onto said second end of said hollow pin with the hot junction thereof substantially coincidental with the center of rotation of said hollow sleeve bearing.

2. A temperature detector, as defined in claim 1, wherein said hollow sleeve bearing is made of a material having high thermal conductivity.

3. A temperature detector, as defined in claim 2, wherein said thermocouple is of the iron-constantan type.

4. A temperature detector, as defined in claim 3, wherein said support member is made of thermoplastic polyester reinforced with glass fiber and said hollow pin is made of steel.

* * * * *